United States Patent
Otsuka et al.

(10) Patent No.: US 10,935,505 B2
(45) Date of Patent: Mar. 2, 2021

(54) SCANNING ELECTRON MICROSCOPE AND METHOD FOR DETERMINING CRYSTAL ORIENTATIONS

(71) Applicant: JEOL Ltd., Tokyo (JP)

(72) Inventors: Takeshi Otsuka, Tokyo (JP); Kenichi Yamashita, Tokyo (JP)

(73) Assignee: JEOL Ltd., Tokyo (JP)

( * ) Notice: Subject to any disclaimer, the term of this patent is extended or adjusted under 35 U.S.C. 154(b) by 154 days.

(21) Appl. No.: 16/234,868

(22) Filed: Dec. 28, 2018

(65) Prior Publication Data

US 2019/0204245 A1 Jul. 4, 2019

(30) Foreign Application Priority Data

Dec. 29, 2017 (JP) .............................. JP2017-255170
Jul. 5, 2018 (JP) .............................. JP2018-128227

(51) Int. Cl.

| | |
|---|---|
| *G01N 23/20008* | (2018.01) |
| *H01J 37/28* | (2006.01) |
| *H01J 37/244* | (2006.01) |
| *G01N 23/2055* | (2018.01) |
| *G01N 23/203* | (2006.01) |
| *G01N 23/207* | (2018.01) |

(52) U.S. Cl.
CPC ..... *G01N 23/20008* (2013.01); *G01N 23/203* (2013.01); *G01N 23/2055* (2013.01); *G01N 23/2076* (2013.01); *H01J 37/244* (2013.01); *H01J 37/28* (2013.01); *G01N 2223/0566* (2013.01); *G01N 2223/079* (2013.01); *H01J 2237/24415* (2013.01); *H01J 2237/24465* (2013.01); *H01J 2237/24475* (2013.01); *H01J 2237/24495* (2013.01); *H01J 2237/2805* (2013.01)

(58) Field of Classification Search
CPC .......... G01N 23/20008; G01N 23/203; G01N 23/2076; G01N 2223/0566; G01N 2223/079; H01J 37/222; H01J 37/28; H01J 37/244; H01J 2237/24475; H01J 2237/24465; H01J 2237/2805; H01J 2237/24495; H01J 2237/24415
See application file for complete search history.

(56) References Cited

U.S. PATENT DOCUMENTS

| 8,748,844 B2 | 6/2014 | Akutsu |
| 8,809,783 B2 | 8/2014 | Wu et al. |
| 2003/0130803 A1* | 7/2003 | Chou ................. G01N 23/2251 702/27 |

(Continued)

FOREIGN PATENT DOCUMENTS

JP 2014178154 A 9/2014

OTHER PUBLICATIONS

Extended European Search Report issued in EP 18248063.2 dated May 24, 2019.

*Primary Examiner* — Brooke Purinton
(74) *Attorney, Agent, or Firm* — The Webb Law Firm

(57) ABSTRACT

A charged particle beam device includes: a plurality of detecting units which detect charged particles diffracted by a specimen; and an intensity pattern information generating unit which generates, based on intensities of a plurality of detection signals output from the plurality of detecting units, intensity pattern information that represents the intensities of the plurality of detection signals as a pattern.

13 Claims, 43 Drawing Sheets

(56) References Cited

U.S. PATENT DOCUMENTS

| | | | |
|---|---|---|---|
| 2011/0186734 A1* | 8/2011 | Hasuda | H01J 37/28 |
| | | | 250/307 |
| 2012/0287258 A1* | 11/2012 | Tsuneta | H01J 7/265 |
| | | | 348/80 |
| 2013/0075272 A1* | 3/2013 | Nakaya | C22F 1/08 |
| | | | 205/292 |
| 2017/0011518 A1 | 1/2017 | Langlois | |
| 2018/0136147 A1* | 5/2018 | Randolph | G01N 23/2257 |

* cited by examiner

SCANNING ELECTRON MICROSCOPE AND METHOD FOR DETERMINING CRYSTAL ORIENTATIONS

CROSS-REFERENCE TO RELATED APPLICATIONS

This application claims priority to Japanese Patent Application Nos. 2017-255170 and 2018-128227, filed Dec. 29, 2017, and Jul. 5, 2018, respectively, the disclosures of which are hereby incorporated in their entirety by reference.

Japanese Patent Application No. 2017-255170, filed on Dec. 29, 2017, and Japanese Patent Application No. 2018-128227, filed on Jul. 5, 2018, are hereby incorporated by reference in their entirety.

BACKGROUND OF THE INVENTION

Field of the Invention

The present invention relates to a charged particle beam device and an analysis method.

Description of Related

It is widely known that electrons exhibit properties of both particles and waves. An old method used by transmission electron microscopes takes advantage of this characteristic to study a crystal structure of a specimen by causing the specimen to interfere with electrons and acquiring a diffraction pattern.

Methods of utilizing a wave property of electrons to analyze a crystal orientation of a specimen are also established with respect to scanning electron microscopes.

Known examples of such methods include an electron back scatter diffraction patterns (EBSD) method and an electron channeling pattern (ECP) method. First, the EBSD method will be described. When an electron beam is incident to a specimen surface from a direction of approximately 70 degrees, electrons are diffracted and emitted from the specimen as backscattered electrons. A diffraction pattern that appears at this point is projected to an EBSD detector and a crystal orientation is analyzed from the obtained diffraction pattern (for example, refer to JP-A-2014-178154).

Next, the ECP method will be described. Signals from a specimen are acquired while varying an incidence angle of an electron beam, and an image is created based on electron beam incidence angles and signal amounts to obtain an interference fringe. The interference fringe is a reflection of a crystal lattice of the specimen and, by analyzing the interference fringe, information on a crystal orientation of the specimen can be obtained.

The EBSD method requires a dedicated detector for acquiring a diffraction pattern. In addition, accelerating electrons incident to the specimen with high accelerating voltage results in inferior spatial resolution.

Furthermore, with the ECP method, since the incidence angle of an electron beam is changed while irradiating one point by the electron beam, a special optical system is required as an irradiating system.

A backscattered electron image is used when evaluating crystallinity of a specimen in a simplified manner such as when evaluating a size of a crystalline particle of the specimen. A backscattered electron image is obtained by detecting backscattered electrons using a detector such as a semiconductor detector which acquires electrons with a relatively high energy level being equal to or higher than several keV. A backscattered electron image enables a size of a crystalline particle to be determined because strength of contrast (channeling contrast) changes in accordance with a crystal orientation.

For example, with iron ore materials, evaluating a size of a crystalline particle is important since the size of the crystalline particle affects strength and performance. However, it is not always necessary to evaluate a crystalline particle by accurately determining a crystal orientation using the EBSD method and, in some cases, simply determining a size of the crystalline particle may suffice.

Therefore, while a size of a crystalline particle may be evaluated by acquiring channeling contrast using a backscattered electron image, since crystalline particles of different orientations may sometimes have a same brightness in a backscattered electron image, a crystalline particle may appear to be larger than an actual size of the crystalline particle.

In addition, while a crystal orientation is important in semiconductors, for example, simply distinguishing a (100) plane from other planes and determining whether or not the (100) plane is oriented in an intended direction may often suffice. Using the EBSD method or the ECP method for such purposes is excessive from a performance perspective and performing a measurement is a hassle. Therefore, there is a need for a convenient and simple analysis method.

SUMMARY OF THE INVENTION

The invention can provide a charged particle beam device and an analysis method capable of readily obtaining information on crystallinity of a specimen.

According to a first aspect of the invention, there is provided a charged particle beam device including:
a plurality of detecting units which detect charged particles diffracted by a specimen; and
an intensity pattern information generating unit which generates, based on intensities of a plurality of detection signals output from the plurality of detecting units, intensity pattern information that represents the intensities of the plurality of detection signals as a pattern.

According to a second aspect of the invention, there is provided an analysis method including:
detecting charged particles diffracted by a specimen with a plurality of detecting units; and
generating, based on intensities of a plurality of detection signals output from the plurality of detecting units, intensity pattern information that represents the intensities of the plurality of detection signals as a pattern.

According to a third aspect of the invention, there is provided an analysis method including:
detecting charged particles diffracted by a specimen while changing a position of a detecting unit; and
generating a line profile based on an intensity of a detection signal output from the detecting unit and a position of the detecting unit.

DESCRIPTION OF THE INVENTION

Figure 1:
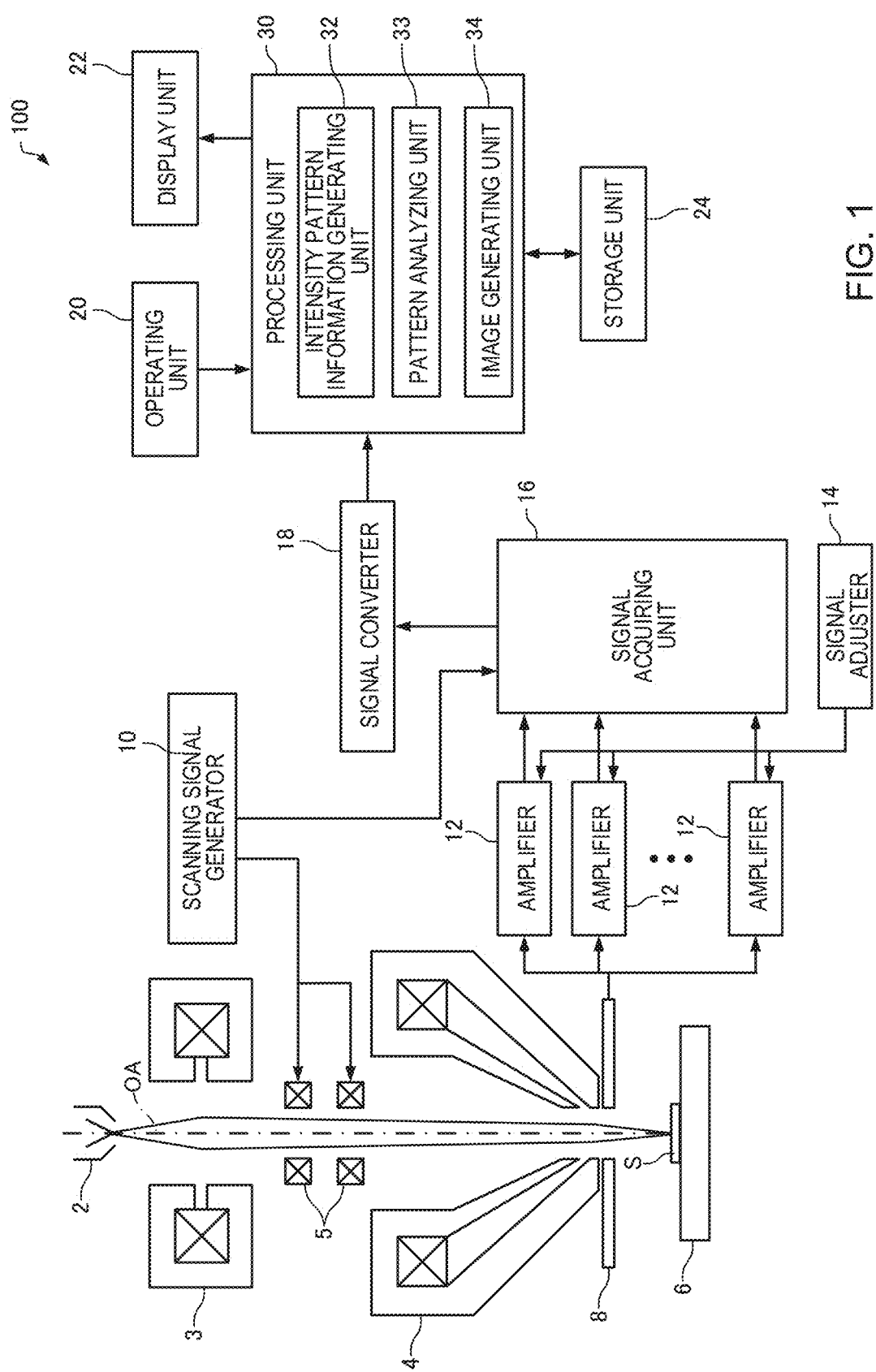
FIG. 1 is a diagram illustrating a configuration of an electron microscope according to a first embodiment.

According to one embodiment of the invention, there is provided a charged particle beam device including:

a plurality of detecting units which detect charged particles diffracted by a specimen; and an intensity pattern information generating unit which generates, based on intensities of a plurality of detection signals output from the plurality of detecting units, intensity pattern information that represents the intensities of the plurality of detection signals as a pattern.

With such a charged particle beam device, intensity pattern information that enables information on crystallinity of a specimen to be obtained can be generated based on intensities of a plurality of detection signals output from the plurality of detecting units. Therefore, information on the crystallinity of a specimen can be readily obtained.

According to one embodiment of the invention, there is provided an analysis method including:

detecting charged particles diffracted by a specimen with a plurality of detecting units; and generating, based on intensities of a plurality of detection signals output from the plurality of detecting units, intensity pattern information that represents the intensities of the plurality of detection signals as a pattern.

With such an analysis method, intensity pattern information that enables information on crystallinity of a specimen to be obtained can be generated based on intensities of a plurality of detection signals output from the plurality of detecting units. Therefore, information on the crystallinity of a specimen can be readily obtained.

According to one embodiment of the invention, there is provided an analysis method including:

detecting charged particles diffracted by a specimen while changing a position of a detecting unit; and generating a line profile based on an intensity of a detection signal output from the detecting unit and a position of the detecting unit.

With such an analysis method, a line profile that enables information on crystallinity of a specimen to be obtained can be generated based on an intensity of a detection signal output from the detecting unit and on a position of the detecting unit. Therefore, information on the crystallinity of a specimen can be readily obtained.

Embodiments of the invention are described in detail below with reference to the drawings. Note that the following embodiments do not unduly limit the scope of the invention as stated in the claims. In addition, all of the elements described in connection with the following embodiments should not necessarily be taken as essential requirements of the invention.

Furthermore, while the charged particle beam device according to the invention will be described below using a scanning electron microscope that performs an observation, an analysis, and the like of a specimen by irradiating an electron beam as an example, the charged particle beam device according to the invention may be an apparatus that performs an observation, an analysis, and the like of a specimen by irradiating a charged particle beam (such as ions) other than an electron beam.

1. First Embodiment

1.1. Electron Microscope

First, an electron microscope according to a first embodiment will be described with reference to the drawings. FIG. 1 is a diagram illustrating a configuration of an electron microscope 100 according to the first embodiment.

As illustrated in FIG. 1, the electron microscope 100 includes an electron source (an example of a charged particle beam source) 2, a condenser lens 3, an objective lens 4, a scanning deflector 5, a specimen stage 6, an electron detector 8, a scanning signal generator 10, an amplifier 12, a signal adjuster 14, a signal acquiring unit 16, a signal converter 18, an operation unit 20, a display unit 22, a storage unit 24, and a processing unit 30.

The electron source 2 generates electrons. The electron source 2 is, for example, an electron gun which accelerates electrons emitted from a cathode by an anode and which emits an electron beam (an example of a charged particle beam).

The condenser lens 3 is a lens which, together with the objective lens 4, causes an electron beam emitted from the electron source 2 to converge to form an electron probe (an example of a charged particle probe). A diameter and a probe current (an irradiating current amount) of the electron probe can be controlled by the condenser lens 3.

The objective lens 4 is a lens for forming an electron probe arranged immediately before a specimen S. For example, the objective lens 4 is configured so as to include a coil and a yoke. In the objective lens 4, magnetic lines created by the coil are encased in the yoke that is made of a material with high magnetic permeability such as iron, and the densely distributed magnetic lines are leaked onto an optical axis OA by creating a notch in a part of the yoke.

The scanning deflector 5 deflects an electron probe (a converged electron beam) formed by the condenser lens 3 and the objective lens 4. The scanning deflector 5 is used in order to scan a surface of the specimen S with the electron probe. The scanning deflector 5 is driven based on a scanning signal generated by the scanning signal generator 10 and deflects an electron beam. As a result, the surface of the specimen S can be scanned with the electron probe.

The specimen S is placed on the specimen stage 6. The specimen stage 6 supports the specimen S. The specimen stage 6 has a drive mechanism for moving the specimen S.

The electron detector 8 detects electrons scattered and diffracted by the specimen S when the specimen S is irradiated with an electron beam. When electrons are incident to the crystalline specimen S, after being scattered, the electrons are diffracted by a lattice plane of a crystal and electrons (backscattered electrons) subjected to diffraction are emitted. In the electron microscope 100, backscattered electrons including the electrons subjected to the diffraction are detected by the electron detector 8.

Figure 2:
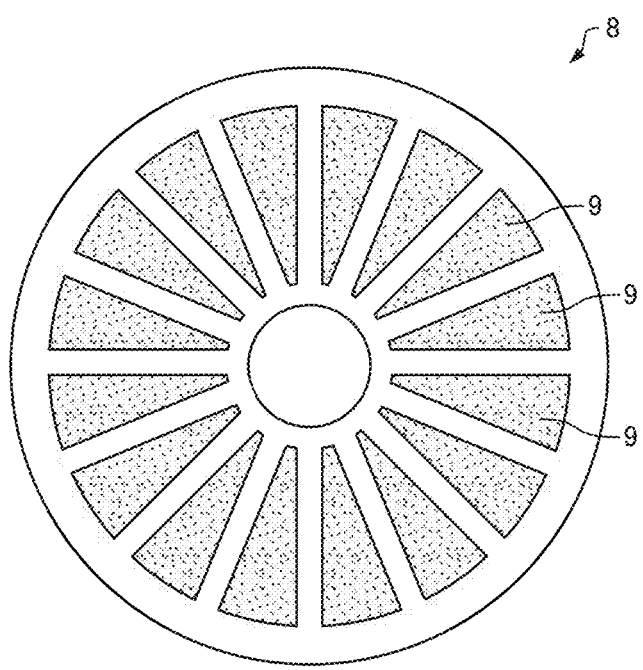
FIG. 2 is a plan view schematically illustrating an electron detector.

FIG. 2 is a plan view schematically illustrating the electron detector 8. As illustrated in FIG. 2, the electron detector 8 is a segmented detector having n-number of detection regions 9 (examples of a detecting unit), where n is an integer equal to or larger than 2 and favorably an integer equal to or larger than 5. In the illustrated example, n=16. The n-number of detection regions 9 are respectively individually capable of detecting electrons. In other words, each of the n-number of detection regions 9 output a detection signal in accordance with an amount of detected electrons. Specifically, a first detection signal is output from a first detection region 9, a second detection signal is output from a second detection region 9, . . . , and an n-th detection signal is output from an n-th detection region 9. In the example illustrated in FIG. 2, in the electron detector 8, 16 detection regions 9 are formed by segmenting an annular detector plane in a circumferential direction. The electron detector 8 is arranged on the optical axis OA. The electron detector 8 is arranged so that the optical axis OA passes through a center of the annular detector plane.

It should be noted that a shape of the detector (the detector plane) and the number of segments are not limited to the example illustrated in FIG. 2. In addition, as the electron detector 8, a plurality of electron detectors respectively having a single detection region may be arranged in place of a segmented detector. In this case, one electron detector constitutes one detecting unit.

Furthermore, while the electron detector 8 is arranged directly underneath the objective lens 4 in the example illustrated in FIG. 1, a position of the electron detector 8 is not particularly limited as long as backscattered electrons diffracted by the specimen S can be detected.

For example, although not illustrated, when using a lens (a snorkel lens) of which resolution under a low accelerating voltage has been increased by actively generating a magnetic field of the lens up to near the specimen S as the objective lens 4 in the electron microscope 100, the electron detector 8 may be arranged inside the objective lens 4. This is because, in this case, electrons emitted from the specimen S more readily pass through a center hole of the objective lens 4 and reach inside the objective lens 4.

In the electron microscope 100, an electron probe is formed by causing an electron beam emitted from the electron source 2 to converge using the condenser lens 3 and the objective lens 4, and a surface of the specimen S is scanned by the electron probe by deflecting the electron beam with the scanning deflector 5. Accordingly, the electrons incident to the specimen S are scattered inside the specimen S and then diffracted by a lattice plane of a crystal. The electrons (backscattered electrons) subjected to diffraction are emitted from the specimen S and a diffraction pattern (a Kikuchi pattern) is formed on the detector plane of the electron detector 8. The backscattered electrons emitted from the specimen S are detected by the electron detector 8.

A detection signal output from the detection region 9 of the electron detector 8 is amplified by the amplifier 12. An amplification factor, an offset amount, and the like of a detection signal in the amplifier 12 are adjusted by the signal adjuster 14.

The signal acquiring unit 16 acquires an amplified detection signal. For example, the signal acquiring unit 16 simultaneously acquires first to n-th detection signals output from the n-number of detection regions 9. The signal acquiring unit 16 receives a scanning signal from the scanning signal generator 10 and acquires information on an incidence position of an electron beam on the specimen S. In the signal acquiring unit 16, a detection signal is associated with information on the incidence position of an electron beam. The signal acquiring unit 16 can be realized by, for example, a dedicated circuit.

A detection signal output from the signal acquiring unit 16 and associated with the incidence position of an electron beam is converted at the signal converter 18 into a signal readable by the processing unit 30.

The operation unit 20 performs a process of acquiring an operation signal that corresponds to an operation performed by a user and sending the operation signal to the processing unit 30. For example, the operation unit 20 is a button, a key, a touch panel display, a microphone, or the like.

The display unit 22 displays an image generated by the processing unit 30. The display unit 22 can be realized by a display such as a liquid crystal display (LCD).

The storage unit 24 stores programs, data, and the like that cause or allow the processing unit 30 to perform various calculation processes and control processes. In addition, the storage unit 24 is used as a work area for the processing unit 30, and temporarily stores results of calculations and the like performed by the processing unit 30 in accordance with various programs. The storage unit 24 can be realized by, for example, a random access memory (RAM), a read only memory (ROM), and a hard disk.

The processing unit 30 performs various control processes, calculation processes, and the like according to the programs stored in the storage unit 24. Functions of the processing unit 30 can be realized by having various processors (a central processing unit (CPU) and the like) execute the programs. The processing unit 30 includes an intensity pattern information generating unit 32, a pattern analyzing unit 33, and an image generating unit 34.

The intensity pattern information generating unit 32 generates intensity pattern information based on intensities of the first to n-th detection signals output from the n-number of detection regions 9. As will be described later, intensity pattern information represents the intensities of the first to n-th detection signals as a pattern. It should be noted that intensity pattern information not only includes information on the pattern itself but also includes information on a matrix when the pattern is represented as a matrix, information on a mathematical expression when the pattern is represented as a mathematical expression, and the like.

The pattern analyzing unit 33 compares intensity patterns generated by the intensity pattern information generating unit 32 with each other and generates pattern analysis information.

The image generating unit 34 generates images based on pattern analysis information associated with the incidence position of an electron beam with respect to the specimen S. Images generated by the image generating unit 34 based on pattern analysis information include a crystal orientation image illustrating a distribution of crystal orientations of the specimen S and a crystal grain boundary image illustrating extracted grain boundaries of crystalline particles to be described later.

Processes performed by the intensity pattern information generating unit 32, processes performed by the pattern analyzing unit 33, and processes performed by the image generating unit 34 will be described later.

1.2. Principles

First, a principle of analysis in the electron microscope 100 will be described.

When electrons are incident to a crystalline specimen, the electrons are scattered and diffracted and electrons (backscattered electrons) subjected to diffraction are emitted from the specimen. By detecting the backscattered electrons subjected to diffraction with a scanning electron microscope and acquiring a scanned electron image, a channeling contrast is obtained of which brightness changes depending on a crystal orientation. Even when irradiating conditions of electrons are the same, changing a position of a detector results in detecting electrons subjected to diffraction in a different manner and the channeling contrast also changes. Therefore, backscattered electrons are detected using a plurality of backscattered electron detectors and a crystal orientation of a specimen can be analyzed based on an intensity of a detection signal of each backscattered electron detector.

1.2.1 Simulation

The presence of a difference in signal intensities due to diffraction depending on a position of a detector was verified by a simulation.

Contents of the simulation were as follows.

As a detector of a scanning electron microscope, an annular backscattered electron detector segmented into 16 equal parts in the circumferential direction as illustrated in FIG. 2 was used and arranged above a specimen (refer to FIG. 1). Assuming that a diffraction pattern is formed on the backscattered electron detector, an intensity of backscattered electrons detected within a predetermined period of time was integrated in each detection region and adopted as a signal intensity of each detection region.

Figure 3:
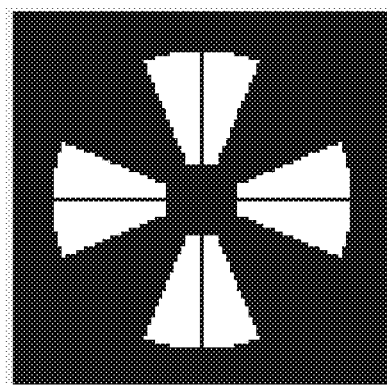
FIG. 3 is a diagram illustrating a result of a simulation.
Figure 4:
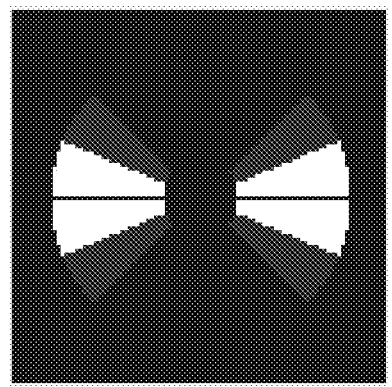
FIG. 4 is a diagram illustrating a result of a simulation.

FIGS. 3 and 4 are diagrams illustrating a result of the simulation. FIG. 3 indicates the signal intensity of each detection region when assuming that a specimen is a crystal with a certain orientation. FIG. 4 indicates the signal intensity of each detection region when an orientation of a crystal was changed in a same specimen. FIGS. 3 and 4 show that bright regions have a large amount of signals and dark regions have a small amount of signals. As a result of the simulation, it was found that the signal intensity of each detection region differs depending on a crystal orientation of the specimen.

1.2.2. Practical Example

Next, as illustrated in FIG. 2, an annular backscattered electron detector segmented into 16 equal parts in the circumferential direction was prepared and mounted to a scanning electron microscope to study whether the signal intensity of each detection region of the segmented detector differs depending on a crystal orientation of the specimen.

Figure 5:
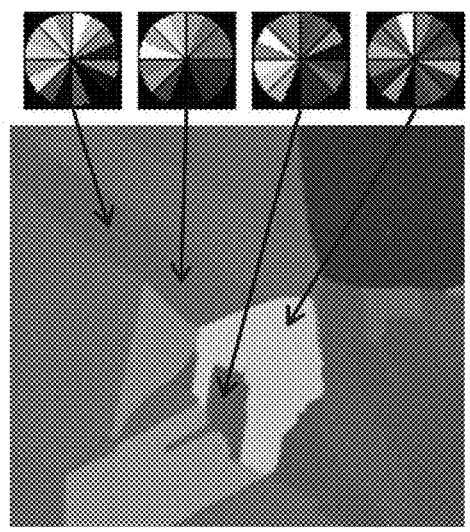
FIG. 5 is a diagram illustrating a distribution of signal intensities in a segmented detector.

FIG. 5 is a diagram illustrating a distribution of signal intensities in the segmented detector. Fan-shaped regions indicate the detection regions and a brightness of the fan-shapes indicates signal intensity. Specifically, it is shown that bright detection regions have a large amount of signals and dark detection regions have a small amount of signals.

A visual examination of the distribution of signal intensities in the segmented detector reveals that the distribution of signal intensities is similar in a same crystalline particle but distributions of signal intensities significantly differ between crystalline particles with different crystal orientations. In addition, even crystalline particles separated from each other have a similar distribution of signal intensities when crystal orientations of the crystalline particles are the same.

Accordingly, it was found that a crystal orientation of a crystalline particle can be analyzed based on a distribution of signal intensities in a segmented detector.

1.3. Processes

Next, processes performed by the processing unit 30 of the electron microscope 100 will be described.

1.3.1. Acquisition of Detection Signal

First, a process of acquiring a detection signal by the processing unit 30 will be described.

First to n-th detection signals output from the n-number of detection regions 9 and acquired by the signal acquiring unit 16 are input to the processing unit 30 together with information on an incidence position of an electron beam with respect to the specimen S as specified by a scanning signal.

Let x, y denote an incidence position of an electron beam with respect to the specimen S, let a detection region z be expressed as z=1, 2, . . . , n where n denotes the number of detection regions 9 of the electron detector 8, and let a three-dimensional array s (x, y, z) represent a signal intensity of a detection signal at x, y, z. Hereinafter, this array s (x, y, z) will be referred to as a signal intensity array. The signal intensity array s (x, y, z) is stored in the storage unit 24.

An image (a scanned image) can be generated based on the signal intensity array s (x, y, z) acquired in this manner.

For example, by creating an image using the incidence position of an electron beam and a sum of intensities of detection signals of the respective detection regions 9 at the incidence position, an image is obtained which is similar to a scanned image obtained by detecting backscattered electrons or, in other words, a backscattered electron image. This image can be expressed by the following equation, where i (x, y) denotes an array of the image.

$$i(x, y) = \sum_{z=1}^{n} s(x, y, z)$$

Alternatively, as indicated by the following equation, an image may be generated by using an intensity of a detection signal of a single detection region 9.

$$i(x,y)=s(x,y,1)$$

In addition, an image may be generated by performing signal processing such as addition or subtraction on detection signals of a plurality of detection regions 9. A process of generating these images is performed by the image generating unit 34.

1.3.2. Generation Method of Intensity Pattern

Next, a method of generating an intensity pattern will be described. The intensity pattern is generated by the intensity pattern information generating unit 32.

The intensities of the first to n-th detection signals (hereinafter, also simply referred to as "signal intensities") are similar signal intensities in a same crystal orientation. Therefore, by adopting a signal intensity at an arbitrary position (hereinafter, also referred to as a "reference position") on the specimen S and comparing the signal intensity with a signal intensity at another position (hereinafter, also referred to as an "analyzed position") on the specimen S, a determination can be made as to whether or not a crystal orientation at the reference position and a crystal orientation at the analyzed position are the same.

Crystallinity is evaluated by respectively generating intensity patterns from the signal intensity at the reference position and the signal intensity at the analyzed position and comparing the two patterns. A method thereof will be described below.

First, an example of a method of converting a signal intensity into an intensity pattern will be described.

When the number of the detection regions 9 is denoted by n, intensities of the first to n-th detection signals at a given incidence position x, y is expressed using the signal intensity array s as $d_1=s (x, y, 1)$, $d_2=s (x, y, 2)$, . . . , $d_n=s (x, y, n)$.

Figure 6:
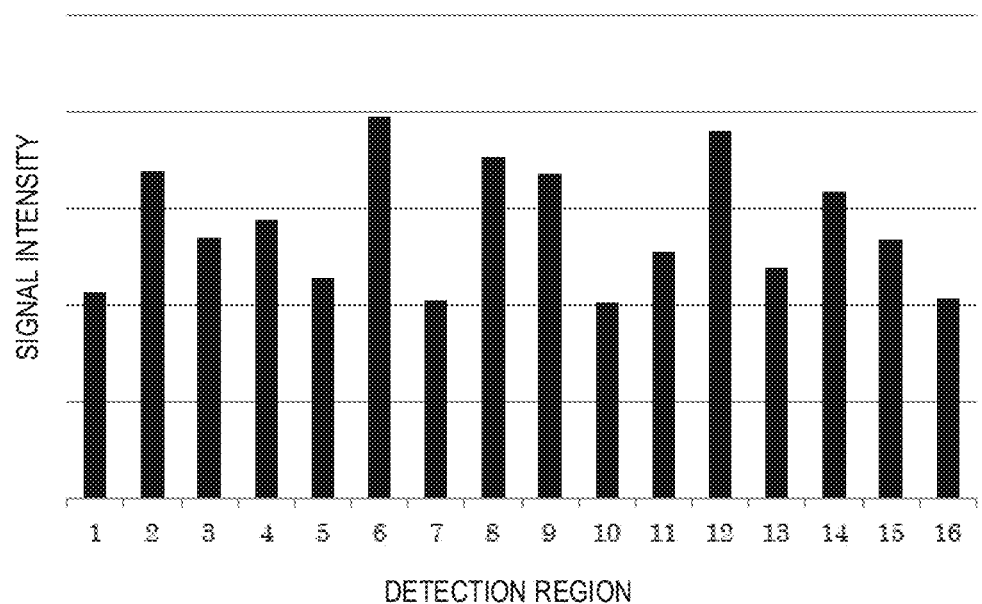
FIG. 6 is a graph illustrating intensities of first to n-th detection signals.

FIG. 6 is a graph illustrating intensities of the first to n-th detection signals. It should be noted that, in FIG. 6, n=16.

When a smallest value among $d_1, d_2, \ldots , d_n$ is denoted by $d_{min}$, an intensity pattern a is obtained by the following equation.

$$a=(d_1/d_{min}, d_2/d_{min}, \ldots ,d_n/d_{min})$$

In this manner, intensities of the first to n-th detection signals are normalized by the intensity of the detection signal with the smallest value. Accordingly, intensities of the first to n-th detection signals can be obtained. The intensity pattern a (an example of intensity pattern information) represented by the matrix described above is obtained from these signal intensities.

Figure 7:
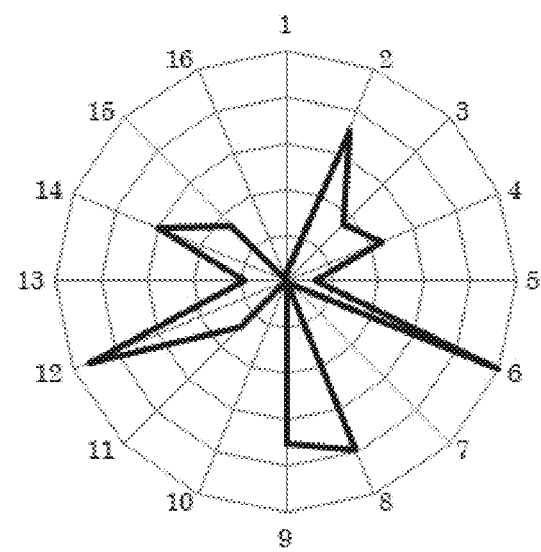
FIG. 7 is a diagram illustrating an intensity pattern generated based on the intensities of the first to n-th detection signals.

FIG. 7 is a diagram illustrating, as a radar chart, an intensity pattern generated based on the intensities of the first to n-th detection signals illustrated in FIG. 6.

FIG. 7 represents a pattern formed by consolidating origins of intensity axes of the first to n-th detection signals to radially arrange the intensity axes, plotting normalized intensities of the first to n-th detection signals on the intensity axes of the first to n-th detection signals, and connecting adjacent points with straight lines.

The generated intensity pattern is stored in the storage unit 24 for each pixel of a scanned image associated with the incidence position of the electron beam.

Next, a modification of the generation method of an intensity pattern will be described.

While an intensity pattern is generated in the description above by normalizing the first to n-th detection signals with the minimum value $d_{min}$, the generation method of an intensity pattern is not limited thereto.

For example, when a smallest value among $d_1, d_2, \ldots , d_n$ is denoted by $d_{min}$ and a largest value among $d_1, d_2, \ldots , d_n$ is denoted by $d_{max}$, the intensity pattern a may be obtained by the following equation.

$$a=((d_1-d_{min})/(d_{max}-d_{min}),(d_2-d_{min})/(d_{max}-d_{min}), \ldots ,(d_n-d_{min})/(d_{max}-d_{min}))$$

Under a condition where a current amount of the electron beam is small, a signal to noise ratio (SN ratio) of the detection signals deteriorates and accuracy of pattern analysis (also referred to as pattern recognition) to be described later declines. In consideration thereof, a matrix obtained by averaging intensity patterns of a periphery of the analyzed position may be used as an intensity pattern. Accordingly, accuracy of pattern analysis can be improved. In this manner, when generating an intensity pattern, a process of improving accuracy of pattern analysis may be performed.

For example, while the number of detectors n and a size of the matrix representing the intensity pattern a are consistent with each other in the example described above, as indicated by the following equation, the number of detectors n and a size of the matrix representing the intensity pattern a need not be consistent with each other.

$$a = \left(d_1/d_{min}, d_2/d_{min}, \ldots, d_n/d_{min}, \frac{1}{n}\sum_{k=1}^{n} d_k/d_{min}\right)$$

For example, an average of the intensities of the first to n-th detection signals may be added as an element of the intensity pattern. In this case, since the average of the intensities of the first to n-th detection signals is added to a pattern generated by using the intensities of the first to n-th detection signals with respect to the number of detectors n, the number of elements of the obtained intensity pattern is n+1.

For example, with a segmented detector having an annular detector plane as illustrated in FIG. 2, when a specimen plane is not parallel to the detector plane, signal intensities are affected by a tilt of the specimen plane and, in turn, pattern analysis is affected. In consideration thereof, generating an intensity pattern by obtaining a difference in intensities of the detection signals of adjacent detection regions 9 emphasizes a difference in signal intensities due to crystal orientation caused by diffraction as indicated by the following equation as compared to, for example, a difference in signal intensities based on the tilt of the specimen plane and, as a result, the accuracy of pattern analysis is improved.

$$a = ((d_1-d_n)/d_{min}, (d_2-d_1)/d_{min}, \ldots, (d_n-d_{n-1})/d_{min})$$

In addition, for example, when dosage of the electron beam is small, a statistical counting error may cause noise to enter an intensity pattern and prevent pattern analysis from being correctly performed. Therefore, an intensity pattern may be generated by averaging signal intensities in a periphery of the incidence position of the electron beam. Accordingly, since noise can be reduced by increasing an amount of statistics, the accuracy of pattern analysis can be improved.

1.3.3. Comparison of Intensity Patterns

Next, a method of comparing a generated intensity pattern with a reference intensity pattern and evaluating a similarity of the patterns will be described. This process is performed by the pattern analyzing unit 33.

Figure 8:
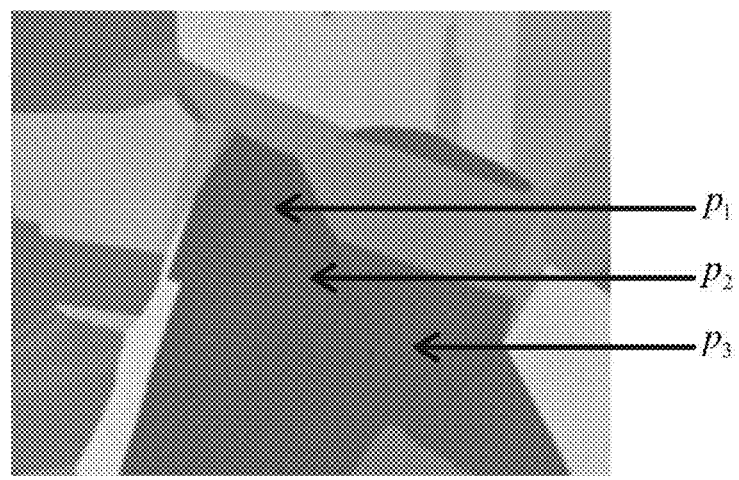
FIG. 8 is a diagram illustrating positions where intensity patterns are acquired.
Figure 9:
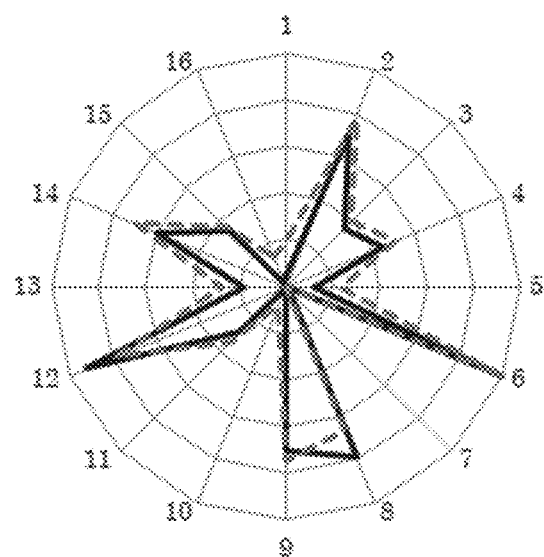
FIG. 9 is a diagram comparing an intensity pattern a with an intensity pattern b.
Figure 10:
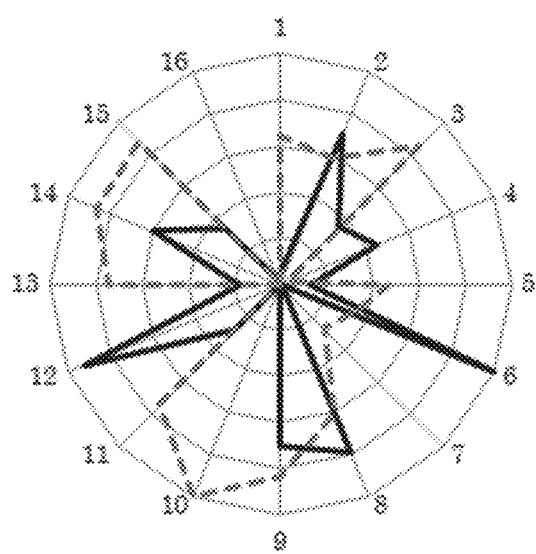
FIG. 10 is a diagram comparing the intensity pattern a with an intensity pattern c.

FIG. 8 is a diagram illustrating positions where intensity patterns are acquired. FIG. 9 is a diagram comparing an intensity pattern a obtained at a point p1 in FIG. 8 with an intensity pattern b obtained at a point p2 in FIG. 8. In FIG. 9, the intensity pattern a is indicated by a solid line and the intensity pattern b is indicated by a dashed line. FIG. 10 is a diagram comparing the intensity pattern a obtained at the point p1 in FIG. 8 with an intensity pattern c obtained at a point p3 in FIG. 8. In FIG. 10, the intensity pattern a is indicated by a solid line and the intensity pattern c is indicated by a dashed line.

Since the intensity pattern a and the intensity pattern b are similar in FIG. 9, a crystal orientation at the point p1 and a crystal orientation at the point p2 may be considered the same. By comparison, since the intensity pattern a and the intensity pattern c are not similar in FIG. 10, the crystal orientation at the point p1 and a crystal orientation at the point p3 may be considered different.

As illustrated in FIGS. 9 and 10, a similarity of two intensity patterns may be readily discerned by overlapping and visually confirming the patterns. However, it is difficult to visually confirm all of the intensity patterns generated in order to evaluate crystallinity. Therefore, the pattern analyzing unit 33 mathematically compares patterns.

Here, a case where Euclidean distance is used as a method of pattern analysis will be described. However, a method of pattern analysis is not limited thereto and other known methods of pattern analysis (for example, a method using the nearest neighbor rule) are also applicable.

First, an intensity pattern to be used as a reference (hereinafter, also referred to as a "reference intensity pattern") is determined. For example, the reference intensity pattern is an intensity pattern selected from generated intensity patterns. In other words, as the reference intensity pattern, one intensity pattern among the plurality of intensity patterns generated in correspondence to a plurality of pixels forming a scanned image is used.

For example, the reference intensity pattern may be an intensity pattern at a pixel positioned at a center of the scanned image. Alternatively, the reference intensity pattern may be an intensity pattern at an arbitrary pixel of the scanned image.

When an intensity pattern of a pixel to be analyzed (hereinafter, also referred to as an "analyzed intensity pattern") is denoted by a and the reference intensity pattern is denoted by b, a similarity of patterns can be determined by obtaining a Euclidean distance D between the reference intensity pattern b and the analyzed intensity pattern a.

The Euclidean distance D can be obtained by equation (1) below.

$$D = \sqrt{\sum_{i=1}^{n} (a_i - b_i)^2} \quad (1)$$

In equation (1), $a_i$ denotes an element of the analyzed intensity pattern a and $b_i$ denotes an element of the reference intensity pattern b. n denotes the number of elements of an intensity pattern. Although n in this case is equal to the number of the detection regions 9, n need not necessarily be equal to the number of the detection regions 9. It can be considered that the shorter the Euclidean distance D, the greater the similarity between the analyzed intensity pattern a and the reference intensity pattern b. In consideration of a variation in patterns due to noise and the like, when the Euclidean distance D to the reference intensity pattern b at a pixel to be analyzed is equal to or shorter than a predetermined value, it is determined that a crystal orientation at the pixel to be analyzed is the same as a crystal orientation of the reference intensity pattern.

1.3.4. Generation of Image

Next, a generation method of an image will be described. A process of generating an image is performed by the image generating unit 34.

(1) Generation of Pattern Analysis Image

First, a method of generating an image (hereinafter, also referred to as a "pattern analysis image") that reflects a result of a pattern analysis will be described.

Hereinafter, an arbitrary pixel of a scanned image is denoted by (x, y), an intensity pattern at the pixel is denoted by $a_{x,y}$, and an analysis result obtained by the pattern analyzing unit 33 is represented by a Euclidean distance $D_{x,y}$. In this case, the Euclidean distance between the reference intensity pattern and the analyzed intensity pattern $a_{x,y}$ is $D_{x,y}$.

When regions of a crystal orientation cd1 and a crystal orientation cd2 exist in an observed field of view, an intensity pattern of the crystal orientation cd1 is adopted as a reference intensity pattern b and a Euclidean distance $D_{x,y}$ to the reference intensity pattern b is obtained for a plurality of pixels included in the region of the crystal orientation cd2. Since these pixels are included in a same region of the crystal orientation cd2, Euclidean distances $D_{x,y}$ have near values. For example, when a plurality of pixels are denoted by (x1, y1) and (x2, y2), the intensity patterns at the respective pixels are expressed as $a_{x1,y1}$ and $a_{x2,y2}$. Since (x1, y1) and (x2, y2) represent points in a same crystal orientation, the intensity patterns of $a_{x1,y1}$ and $a_{x2,y2}$ resemble one another. Therefore, the Euclidean distance $D_{x1,y1}$ and the Euclidean distance $D_{x2,y2}$ between the respective intensity patterns and the reference intensity pattern b also have near values.

Therefore, an intensity pattern of an arbitrary point in an observed field of view (for example, a center of the field of view) is adopted as a reference intensity pattern b and, for each of pixels forming a scanned image, a Euclidean distance $D_{x,y}$ to the reference intensity pattern b is obtained. In addition, generating an image by associating a magnitude of the Euclidean distance $D_{x,y}$ at each pixel with brightness results in an image (a pattern analysis image) in which a crystalline particle with a different crystal orientation is displayed with a different brightness.

Figure 11:
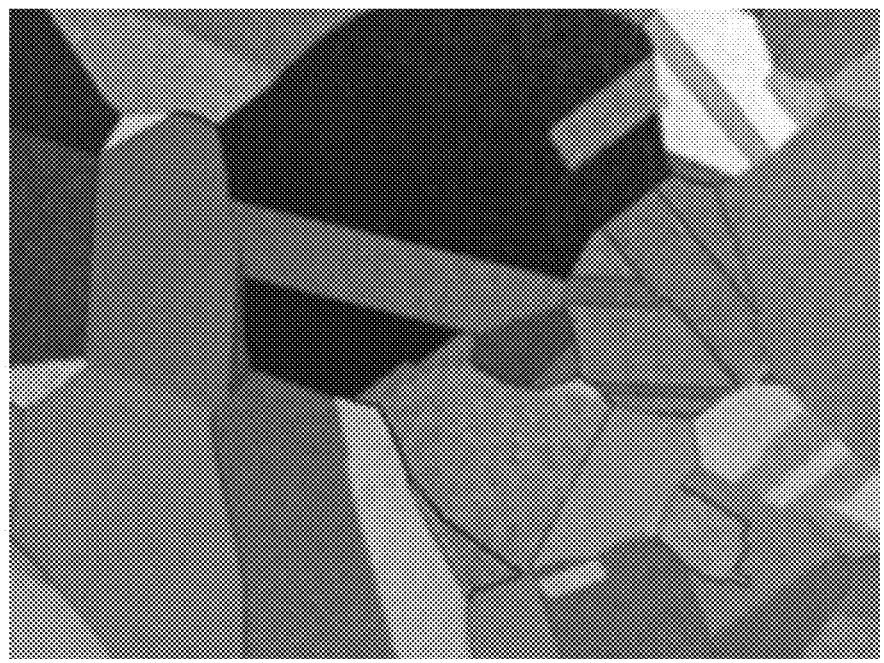
FIG. 11 is a pattern analysis image in a case where an intensity pattern at a pixel at a center of a field of view is adopted as a reference intensity pattern.
Figure 12:
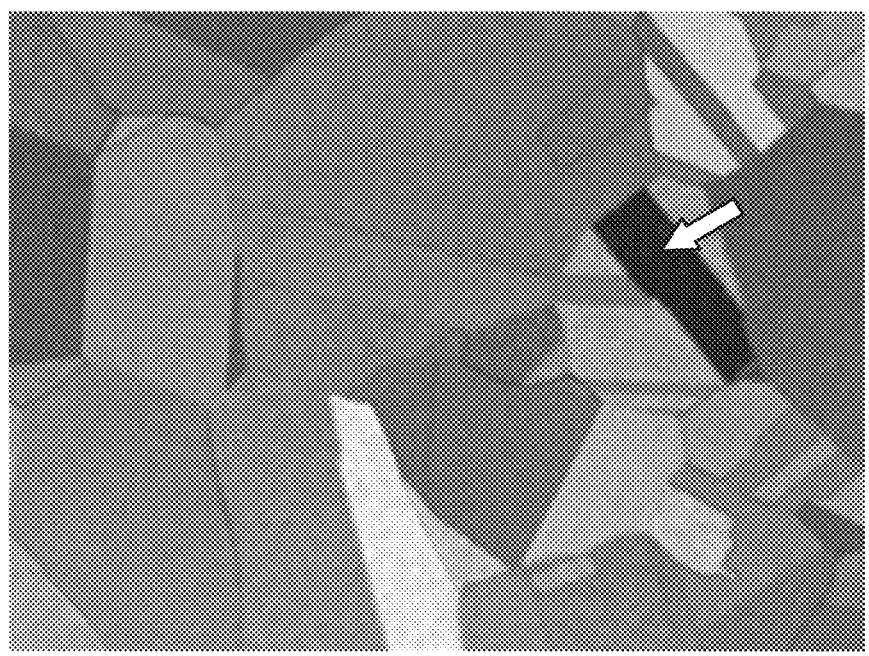
FIG. 12 is a pattern analysis image in a case where an intensity pattern at a pixel indicated by an arrow is adopted as a reference intensity pattern.

FIG. 11 is a pattern analysis image in a case where an intensity pattern at a pixel at a center of a field of view is adopted as the reference intensity pattern b. FIG. 12 is a pattern analysis image in a case where an intensity pattern at a pixel indicated by an arrow is adopted as the reference intensity pattern b.

As illustrated in FIGS. 11 and 12, when the reference intensity pattern b differs, an obtained pattern analysis image differs. In the illustrated example, when the reference intensity pattern b and the analyzed intensity pattern a are similar (in other words, when the Euclidean distance $D_{x,y}$ is short), the pixel is dark, and when the reference intensity pattern b and the analyzed intensity pattern a are not similar (in other words, when the Euclidean distance $D_{x,y}$ is long), the pixel is bright. However, with this method, bright pixels do not necessarily represent similar intensity patterns.

In consideration thereof, pattern analysis can be performed with greater accuracy by preparing a plurality of reference intensity patterns and obtaining the Euclidean distance $D_{x,y}$ with respect to each of the plurality of reference intensity patterns.

For example, first, an intensity pattern at an arbitrary pixel is adopted as a reference intensity pattern b1 and, for each of pixels forming a scanned image, a Euclidean distance $D1_{x,y}$ to the reference intensity pattern b1 is obtained.

Next, a pixel with a longest Euclidean distance $D1_{x,y}$ is selected from the plurality of pixels forming the scanned image and an intensity pattern at the pixel is adopted as a new reference intensity pattern b2. In addition, for each of the pixels forming the scanned image, a Euclidean distance $D2_{x,y}$ to the reference intensity pattern b2 is obtained.

Next, a pixel with a largest sum of the Euclidean distance $D1_{x,y}$ and the Euclidean distance $D2_{x,y}$ is selected from the plurality of pixels forming the scanned image and an intensity pattern at the pixel is adopted as a new reference intensity pattern b3. In addition, for each of the pixels forming the scanned image, a Euclidean distance $D3_{x,y}$ to the reference intensity pattern b3 is obtained.

Next, a first scanned image is formed by associating brightness of each of the pixels forming the scanned image with a magnitude of the Euclidean distance $D1_{x,y}$. In this case, red is assigned to the first scanned image. In a similar manner, a second scanned image is formed by associating brightness of each of the pixels forming the scanned image with a magnitude of the Euclidean distance $D2_{x,y}$. In this case, green is assigned to the second scanned image. In a similar manner, a third scanned image is formed by associating brightness of each of the pixels forming the scanned image with a magnitude of the Euclidean distance $D3_{x,y}$. In this case, blue is assigned to the third scanned image.

Next, the first scanned image, the second scanned image, and the third scanned image are overlapped with each other to form a single image. Accordingly, a pattern analysis image of the specimen S generated by using the three reference intensity patterns b1, b2, and b3 is obtained.

Figure 13:
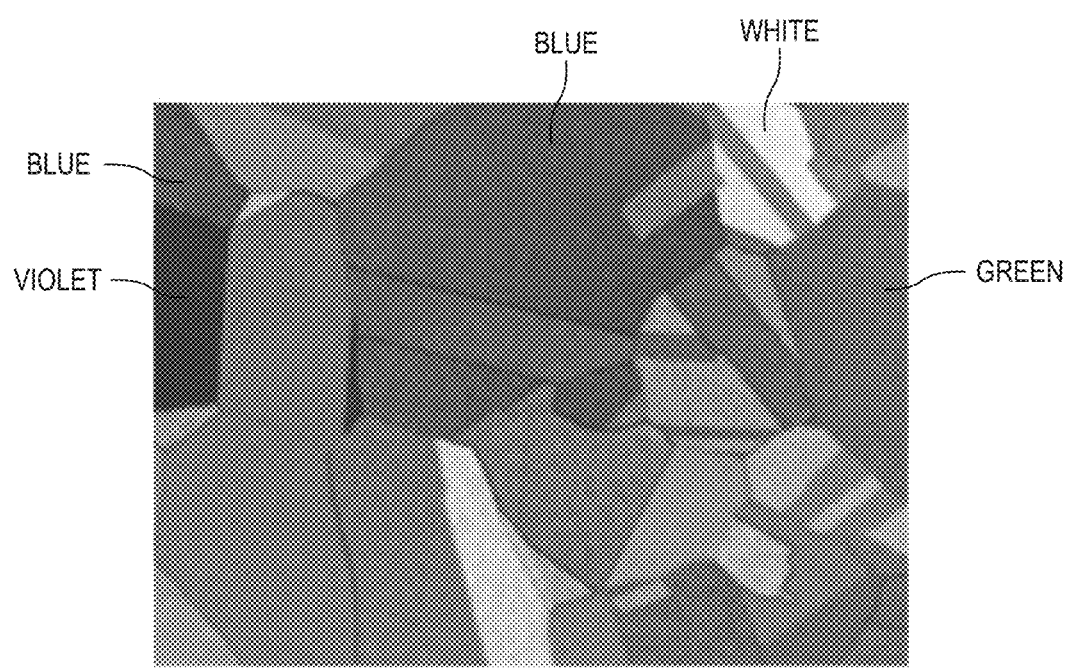
FIG. 13 is a pattern analysis image generated by using three reference intensity patterns.

FIG. 13 is a pattern analysis image of the specimen S which is generated by using three reference intensity patterns.

As illustrated in FIG. 13, in a pattern analysis image generated by using three reference intensity patterns, pixels with a high similarity of patterns have near colors. In other words, pixels represented by the same color in FIG. 13 are pixels having a same crystal orientation. In FIG. 13, since three reference intensity pattern are used, a difference in crystal orientations can be more accurately reflected onto an image as compared to a case where, for example, only one reference intensity pattern is used.

Figure 14:
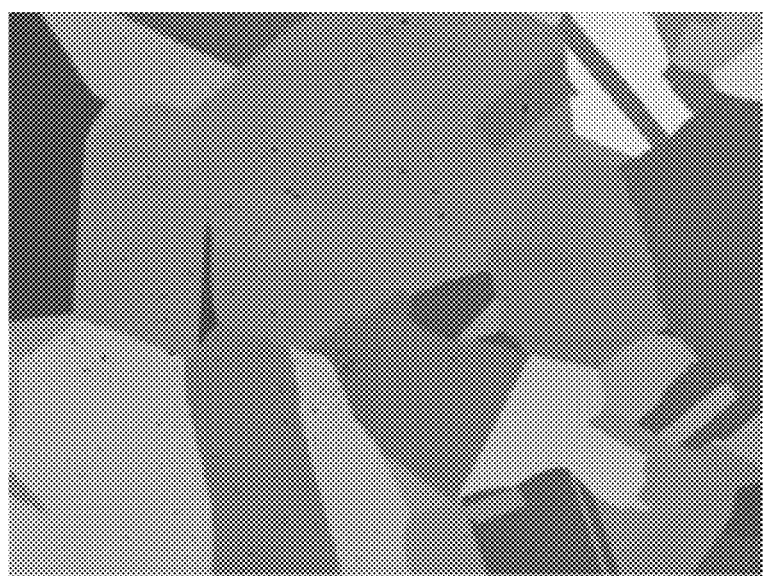
FIG. 14 is a backscattered electron image of a specimen.

FIG. 14 is a backscattered electron image of the specimen S. It should be noted that the pattern analysis image illustrated in FIG. 13 and the backscattered electron image illustrated in FIG. 14 represent a same field of view.

As illustrated in FIG. 14, although a channeling contrast enables crystalline particles to be distinguished even in a backscattered electron image, it is difficult to discern boundaries when adjacent crystalline particles have similar contrasts. By comparison, in the pattern analysis image illustrated in FIG. 13, boundaries between crystalline particles are clearer than in the backscattered electron image.

While a case where a pattern analysis image is generated by using three reference intensity patterns has been described above, the number of reference intensity patterns used to generate a pattern analysis image is not particularly limited. In a similar manner, a selection method of a reference intensity pattern is not limited to the method used in the example described above.

(2) Generation of Crystal Grain Boundary Image

Next, a method of generating an image in which crystal grain boundaries are extracted (hereinafter, also referred to as a "crystal grain boundary image") will be described.

An intensity pattern at an arbitrary pixel (x, y) is adopted as a reference intensity pattern and, at pixels surrounding the pixel (x, y), Euclidean distances to the reference intensity pattern are obtained and a sum of the Euclidean distances is calculated. When there is a different crystal orientation in the pixels surrounding the pixel (x, y), the sum of the Euclidean distances increases. Therefore, the presence or absence of a grain boundary can be discerned based on a sum of Euclidean distances. Hereinafter, the generation method of a crystal grain boundary image will be described more concretely.

In a scanned image, a pixel to be used as a reference will be referred to as a reference pixel (x, y) and an intensity pattern at the reference pixel will be referred to as a reference intensity pattern. In addition, Euclidean distances are obtained with respect to pixels (x, y−1), (x−1, y), (x+1, y), and (x, y+1) which surround the reference pixel (x, y).

In this case, a range of x is set to 0 to xmax and a range of y is set to 0 to ymax. In the case of a reference pixel (0, 0), since the surrounding pixels (0, −1), (−1, 0), (1, 0), and (0, 1) fall outside of the ranges described above, the reference pixel is set so that the surrounding pixels fit within the ranges described above.

First, Euclidean distances are respectively calculated with respect to pixels (1, 0), (0, 1), (2, 1), and (1, 2) which surround a reference pixel (1, 1) and a sum $Db_{1,\ 1}$ of the Euclidean distances is obtained.

Specifically, first, a Euclidean distance between an intensity pattern at the reference pixel (1, 1) and an intensity pattern at the pixel (1, 0) is calculated. In a similar manner, a Euclidean distance between the intensity pattern at the reference pixel (1, 1) and an intensity pattern at the pixel (0, 1), a Euclidean distance between the intensity pattern at the reference pixel (1, 1) and an intensity pattern at the pixel (2, 1), and a Euclidean distance between the intensity pattern at the reference pixel (1, 1) and an intensity pattern at the pixel (1, 2) are calculated. In addition, a sum $Db_{1,\ 1}$ of the four calculated Euclidean distances is obtained.

In a similar manner, Euclidean distances are respectively calculated with respect to pixels (2, 0), (1, 1), (3, 1), and (2, 2) which surround a reference pixel (2, 1) and a sum $Db_{2,\ 1}$ of the Euclidean distances is obtained. This process is performed with respect to all pixels of the scanned image for which a Euclidean distance to surrounding pixels can be calculated.

In this manner, with respect to all pixels of the scanned image for which a Euclidean distance to surrounding pixels can be calculated, a process is performed which involves respectively calculating Euclidean distances at pixels surrounding a reference pixel while changing pixels to be used as the reference pixel and obtaining a sum of the Euclidean distances. Accordingly, sum $Db_{1,\ 1}$, sum $Db_{2,\ 1}$, . . . , sum $Db_{xmax-1,\ ymax-1}$ are obtained.

Next, an image is generated by using sum $Db_{1,\ 1}$, sum $Db_{2,\ 1}$, . . . , sum $Db_{xmax-1,\ ymax-1}$. For example, a maximum value and a minimum value are obtained from sum $Db_{1,\ 1}$, sum $Db_{2,\ 1}$, . . . , sum $Db_{xmax-1,\ ymax-1}$ and an image is created by representing brightness of the image with a grayscale so that the maximum value corresponds to white and the minimum value corresponds to black. As a result, a crystal grain boundary image with enhanced crystal grain boundaries is obtained.

Figure 15:
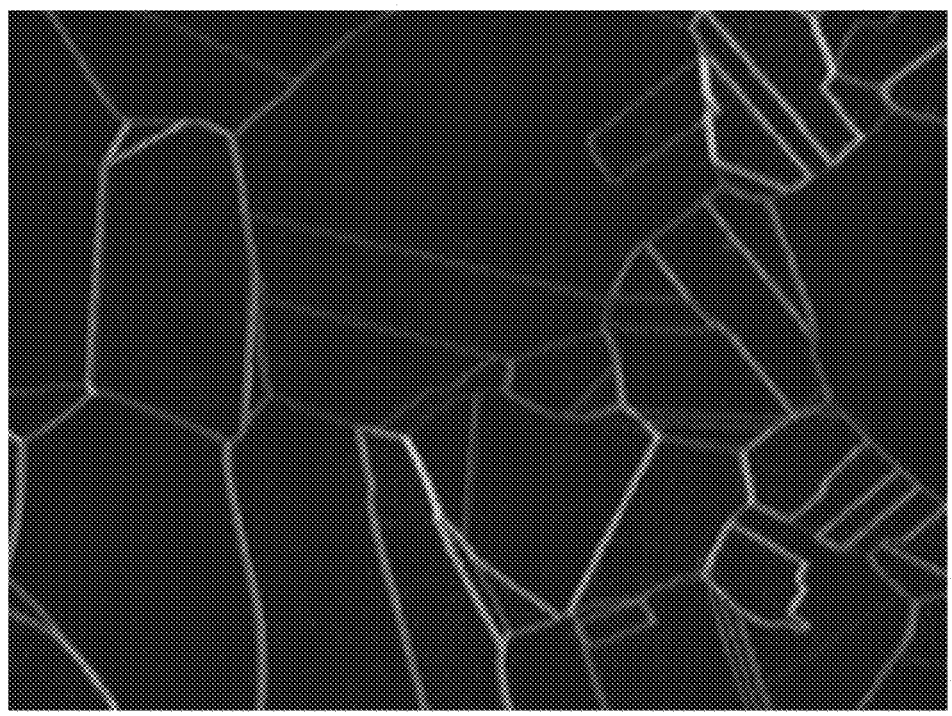
FIG. 15 is a crystal grain boundary image of a specimen.

FIG. 15 is a crystal grain boundary image of the specimen S. As illustrated in FIG. 15, in the crystal grain boundary image, the crystal grain boundaries are displayed highlighted in white.

It should be noted that a generation method of a crystal grain boundary image is not limited to the method described above. For example, with respect to values of sum $Db_{1,\ 1}$, sum $Db_{2,\ 1}$, . . . , sum $Db_{xmax-1,\ ymax-1}$, a crystal grain boundary image may be generated by generating a binary image in which a value equal to or larger than a predetermined value is colored white and a value smaller than the predetermined value is colored black.

In addition, while a case where Euclidean distances are calculated with respect to pixels positioned above, below, to the left, and to the right of the reference pixel (x, y) has been described above, a range of surrounding pixels for which Euclidean distances are to be calculated can be further expanded. For example, when a grain boundary is large, the surrounding pixels for which Euclidean distances are to be calculated may be pixels distant from a reference pixel.

In addition, when a detection signal includes a large noise, the effect of the noise may increase a Euclidean distance and a false recognition of a grain boundary may occur. Therefore, an average of an intensity pattern at the reference pixel and the intensity patterns at surrounding pixels may be adopted as a reference intensity pattern. Accordingly, the effect of noise can be reduced.

Furthermore, when observing a crystal grain boundary image in real time, a signal intensity array s (x, y, z) is acquired while scanning an electron probe. In addition, with a pixel corresponding to an incidence position of an electron beam as the reference pixel (x, y), a crystal grain boundary image may be generated by calculating Euclidean distances with respect to pixels (x, y−1), (x−1, y) corresponding to a region where the electron beam has already passed and obtaining a sum of the Euclidean distances. As described above, a manner in which surrounding pixels are set is not particularly limited.

(3) Measurement of Size of Crystalline Particle

A size of a crystalline particle can be measured using an intensity pattern stored for each of pixels forming a scanned image. A process of measuring the size of a crystalline particle is performed by the image generating unit 34.

For example, when a user wishes to know the size of a crystalline particle, by specifying an arbitrary pixel that includes a crystalline particle in a scanned image as a reference pixel, the size of the crystalline particle can be measured by obtaining a Euclidean distance to an intensity pattern at the reference pixel (a reference intensity pattern) with respect to other pixels forming the scanned image. A method thereof will be described below.

An intensity pattern at a pixel specified by the user is adopted as a reference intensity pattern and, for all pixels forming the scanned image, a Euclidean distance $D_{x,\ y}$ is obtained. While a pixel (x, y) with a Euclidean distance $D_{x,\ y}$ that is equal to or shorter than a predetermined value has a same orientation, there is a possibility that the pixel (x, y) may represent a different crystalline particle. Therefore, a region which includes the pixel (x, y) and of which the Euclidean distance $D_{x,\ y}$ is equal to or shorter than a predetermined value is extracted. The number of pixels in the extracted region is obtained and an area per pixel is calculated from a scan width. Subsequently, an area of the specified crystalline particle is obtained as a product of the number of pixels and the area per pixel.

1.4. Flow of Processes

Figure 16:
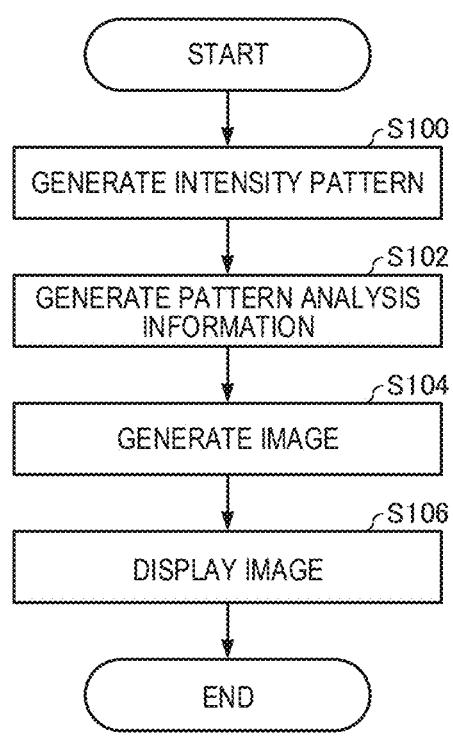
FIG. 16 is a flowchart illustrating an example of a flow of processes by a processing unit of the electron microscope according to the first embodiment.

Next, a flow of processes performed by the processing unit 30 of the electron microscope 100 according to the first embodiment will be described. FIG. 16 is a flowchart illustrating an example of the flow of processes by the processing unit 30 of the electron microscope 100 according to the first embodiment.

In the electron microscope 100, a specimen S is scanned by an electron probe, backscattered electrons from incidence positions of an electron beam is detected by a plurality of the detection regions 9, and for each incidence position (in other words, for each of pixels forming a scanned image), first to n-th detection signals output from n-number of detection regions 9 are acquired.

The first to n-th detection signals acquired by the signal acquiring unit 16 are input to the processing unit 30 together with information on an incidence position of an electron beam with respect to the specimen S as specified by a scanning signal.

The intensity pattern information generating unit 32 generates an intensity pattern based on intensities of the first to n-th detection signals (S100).

Specifically, the intensity pattern information generating unit 32 acquires intensities $d_1, d_2, \ldots, d_n$ of the first to n-th detection signals, normalizes the intensities $d_1, d_2, \ldots, d_n$ of the first to n-th detection signals, and generates an intensity pattern $a=(d_1/d_{min}, d_2/d_{min}, \ldots, d_n/d_{min})$ based on the intensities of the first to n-th detection signals.

The intensity pattern information generating unit 32 performs the process described above for each incidence position of the electron beam (in other words, for each of the pixels forming the scanned image) to generate an intensity pattern. The intensity pattern information generating unit 32 associates the generated intensity pattern with an incidence position of the electron beam and stores the associated intensity pattern in the storage unit 24. In other words, an intensity pattern a is stored in the storage unit 24 in correspondence with each of a plurality of pixels forming the scanned image.

Next, based on the intensity pattern a stored in the storage unit 24, the pattern analyzing unit 33 generates pattern analysis information for each incidence position of the electron beam (S102).

For example, when generating a pattern analysis image, the pattern analyzing unit 33 obtains a Euclidean distance to a reference intensity pattern used as a reference for each of the pixels forming the scanned image. The Euclidean distance is adopted as the pattern analysis information.

Alternatively, for example, when generating a crystal grain boundary image, with respect to all pixels of the scanned image for which a Euclidean distance to surrounding pixels can be calculated, the pattern analyzing unit 33 performs a process which involves respectively calculating Euclidean distances with respect to pixels surrounding a reference pixel while changing pixels to be used as the reference pixel and obtaining a sum of the Euclidean distances. The sum is adopted as the pattern analysis information.

Next, the image generating unit 34 generates an image based on the pattern analysis information generated by the pattern analyzing unit 33 (S104).

For example, when generating a pattern analysis image, the image generating unit 34 generates the pattern analysis image by setting a brightness of a pixel in accordance with the Euclidean distance.

Alternatively, for example, when generating a crystal grain boundary image, the image generating unit 34 generates the crystal grain boundary image by setting a brightness of a pixel in accordance with a sum value of Euclidean distances obtained by an analysis performed by the pattern analyzing unit 33.

The image generating unit 34 performs control for causing the generated image to be displayed by the display unit 22 (S106).

1.5. Features

For example, the electron microscope 100 has the following features.

The electron microscope 100 includes: the electron detector 8 provided with the plurality of detection regions 9 which detect electrons diffracted by a specimen S; and the intensity pattern information generating unit 32 which generates, based on intensities of first to n-th detection signals output from the plurality of detection regions 9, an intensity pattern that represents the intensities of the first to n-th detection signals as a pattern. In the electron microscope 100, since an intensity pattern can be generated based on the intensities of the first to n-th detection signals, for example, a dedicated detector for performing a measurement by the EBSD method or a special irradiating system for performing a measurement by the ECP method is no longer required and information on crystallinity of the specimen S can be readily obtained.

In addition, with the electron microscope 100, since a measurement can be performed by detecting backscattered electrons with the electron detector 8 provided with the plurality of detection regions 9, a measurement can be performed within a shorter period of time as compared to, for example, measurements by the EBSD method and the ECP method.

For example, when evaluating a size of a crystalline particle by acquiring a backscattered electron image, the size of the crystalline particle cannot be accurately evaluated because different crystalline particles may also be displayed with a same brightness. By comparison, with the electron microscope 100, since an image is generated from an intensity pattern, such a problem does not occur. Therefore, with the electron microscope 100, an image (a pattern analysis image or a crystal grain boundary image) can be obtained which enables a size of a crystalline particle to be evaluated more accurately than with a backscattered electron image.

The electron microscope 100 includes: the scanning deflector 5 for scanning a surface of the specimen S with an electron probe; the pattern analyzing unit 33 which analyzes an intensity pattern associated with an incidence position of an electron beam with respect to the specimen S; and the image generating unit 34 which generates an image based on an analysis result of an intensity pattern by the pattern analyzing unit 33. Therefore, with the electron microscope 100, a pattern analysis image which reflects a crystal orientation of the specimen S and a crystal grain boundary image in which crystal grain boundaries are extracted can be obtained. Therefore, with the electron microscope 100, information on the crystallinity of the specimen S can be readily obtained within a short period of time.

In the electron microscope 100, the pattern analyzing unit 33 acquires reference intensity pattern information based on an intensity pattern associated with the incidence position of an electron beam with respect to the specimen S. Therefore, with the electron microscope 100, for example, by generating a pattern analysis image using an intensity pattern of a crystalline particle of interest as a reference intensity pattern, a difference in crystal orientations between the crystalline particle of interest and another crystalline particle can be visualized.

In the electron microscope 100, the pattern analyzing unit 33 compares a reference intensity pattern to be used as a reference with a generated intensity pattern, and the image generating unit 34 generates a crystal grain boundary image in which crystal grain boundaries of the specimen S are extracted. Therefore, with the electron microscope 100, a crystal grain boundary image of the specimen S can be readily obtained within a short period of time.

In the electron microscope 100, electrons diffracted by the specimen S are detected by a segmented detector (the electron detector 8) having a plurality of detection regions 9. Therefore, with the electron microscope 100, a measurement can be performed within a shorter period of time as compared to, for example, measurements by the EBSD method and the ECP method.

In the electron microscope 100, the intensity pattern information generating unit 32 generates an intensity pattern by normalizing intensities of a plurality of detection signals output from the plurality of detection regions 9. Therefore, with the electron microscope 100, information on crystallinity can be readily obtained.

2. Second Embodiment

2.1. Electron Microscope

Figure 17:
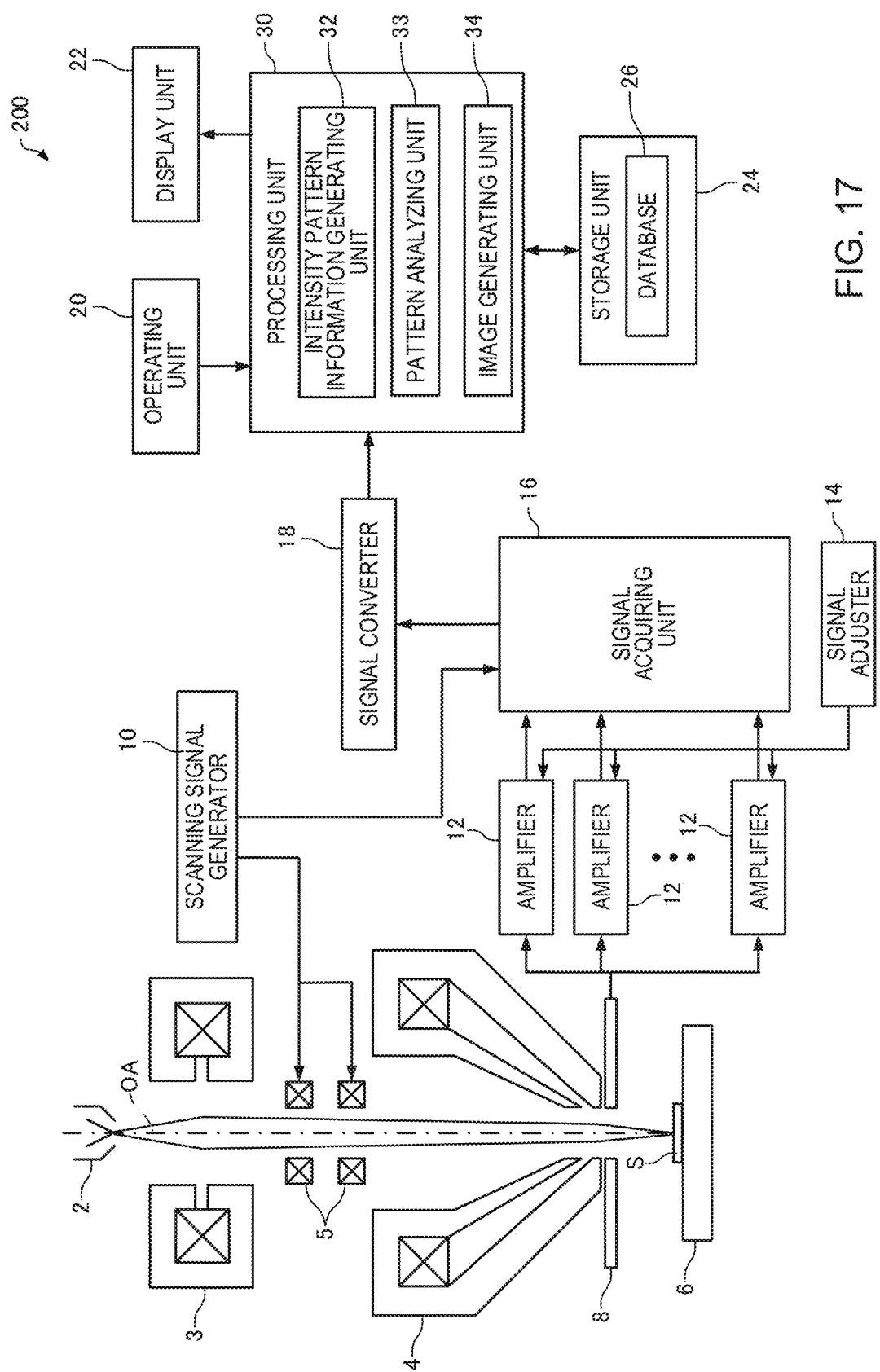
FIG. 17 is a diagram illustrating a configuration of an electron microscope according to a second embodiment.

Next, an electron microscope according to a second embodiment will be described with reference to the drawings. FIG. 17 is a diagram illustrating a configuration of an electron microscope 200 according to the second embodiment. Hereinafter, in the electron microscope 200 according to the second embodiment, members having similar functions to the components of the electron microscope 100 according to the first embodiment will be denoted by same reference characters and a detailed description thereof will be omitted.

As illustrated in FIG. 17, in the electron microscope 200, a database 26 in which a reference intensity pattern is registered is stored in the storage unit 24 for each crystal orientation.

As described above, when crystal orientations are the same, intensity patterns are also the same. Therefore, by using an intensity pattern of a specimen a crystal orientation of which is known as a reference intensity pattern and comparing an analyzed intensity pattern at an analyzed position with the reference intensity pattern, a determination can be made as to whether or not the crystal orientation at the analyzed position is the same as the crystal orientation of the reference intensity pattern.

Therefore, the database 26 in which a reference intensity pattern is registered is prepared for each composition of a specimen and each crystal orientation of the specimen and stored in the storage unit 24 in advance. The reference intensity pattern to be registered in the database 26 can be obtained by acquiring an intensity pattern using a specimen crystal orientations of which have been measured in advance using the EBSD method or the ECP method.

Measurement conditions under which the intensity pattern had been measured are also registered in the database 26. This is because, even with a same crystal orientation of a same specimen, an intensity distribution of diffracted electrons may sometimes differ depending on measurement conditions. When acquiring an intensity pattern of the specimen S to be analyzed, a measurement is favorably performed under the same measurement conditions as the measurement conditions registered in the database 26.

The measurement conditions registered in the database 26 are conditions including an accelerating voltage, an operating distance, and an incidence angle of an electron beam which affect formation of an intensity pattern. When necessary, a plurality of measurement conditions and intensity patterns under the plurality of measurement conditions may be registered in the database 26.

In addition, an intensity pattern of a desired crystal orientation may be obtained by a simulation and registered in the database 26 as a reference intensity pattern.

Alternatively, the database 26 may not be stored in the storage unit 24 prior to a measurement of the specimen S to be analyzed. Intensity patterns of various crystal orientations may be obtained by a simulation calculation based on measurement conditions of the specimen S and the like and the intensity patterns may be adopted as reference intensity patterns.

It should be noted that, in the second embodiment, depending on the number of detection regions, measurement conditions, crystallinity of a specimen, and the like, similar intensity patterns (in other words, short Euclidean distances) may be obtained even when crystal orientations differ. Therefore, when it is determined that the analyzed intensity pattern is similar to a plurality of reference intensity patterns, a process of notifying the user that there are a plurality of crystal orientation candidates for the pixel may be performed.

While an explanation related to the electron detector 8 and a rotation of a crystal orientation has been omitted in the description above, in an actual analysis, even when crystal orientations observed from a normal direction of the specimen S at the analyzed position and the reference position are consistent, the analyzed intensity pattern and the reference intensity pattern are not consistent if a crystal orientation has been rotated on a specimen plane.

Figure 18:
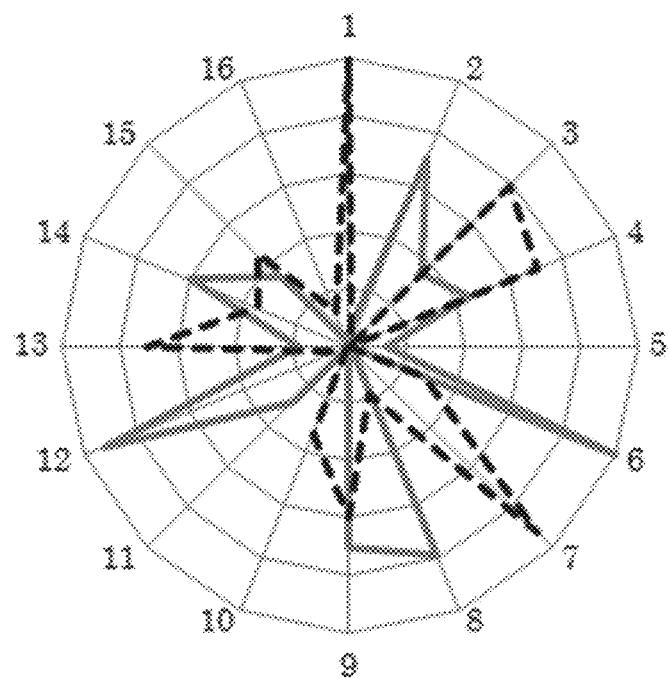
FIG. 18 is a diagram comparing a reference intensity pattern and an analyzed intensity pattern with each other in a case where crystal orientations are the same but rotation angles of the crystal orientations differ.
Figure 19:
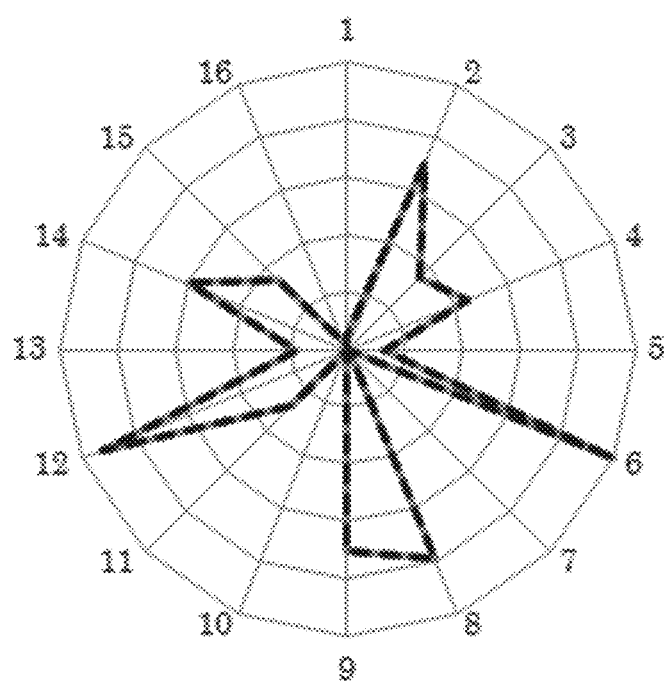
FIG. 19 is a diagram in which a reference intensity pattern is rotated by 112.5 degrees and compared with an analyzed intensity pattern.

FIG. 18 is a diagram comparing a reference intensity pattern b and an analyzed intensity pattern a with each other in a case where crystal orientations are the same but rotation angles of the crystal orientations differ. FIG. 19 is a diagram in which the reference intensity pattern b illustrated in FIG. 18 is rotated by 112.5 degrees and compared with the analyzed intensity pattern a. In FIGS. 18 and 19, the reference intensity pattern b is indicated by a dashed line and the analyzed intensity pattern a is indicated by a solid line.

In FIG. 18, the reference intensity pattern b and the analyzed intensity pattern a appear to be different. However, as illustrated in FIG. 19, when the reference intensity pattern b is rotated, the reference intensity pattern b and the analyzed intensity pattern a become consistent. Therefore, when specifying a crystal orientation, a rotation of the crystal orientation must also be taken into consideration. Hereinafter, an analysis method which takes a rotation of a crystal orientation into consideration will be described.

When taking the rotation of a crystal orientation into consideration, since there is a need to be able to acquire a similar intensity pattern even when the specimen S is rotated, the plurality of detection regions 9 are arranged so as to be rotationally symmetric around the optical axis OA. Since the electron beam travels along the optical axis OA, as illustrated in FIG. 2, a detector plane of the electron detector 8 has a circular shape with a through-hole provided at a center thereof. Alternatively, for example, the detector plane of the electron detector 8 may be shaped as a polygon equally segmented in the circumferential direction. In addition, as the electron detector 8 having a plurality of the detection regions 9, a detector having a single detection region may be prepared in plurality and arranged so as to be rotationally symmetric.

Furthermore, when amplifying detection signals, amplification factors of the detection signals are set to be consistent with one another. In a similar manner, when zero points are shifted between detection signals, the zero points are set to be consistent with one another.

Let $\phi_d$ denote a minimum angle at which a rotationally symmetric detector plane having been rotated becomes consistent with an original detector plane and $\phi_p$ denote an angular shift between the reference intensity pattern b and the analyzed intensity pattern a. When m expressed as $m=\phi_p/\phi_d$ is an integer or a near-integer value (for example, $\phi_d \approx \phi_p$), since the reference intensity pattern and the analyzed intensity pattern have been rotated, rotation of patterns is taken into consideration when performing a pattern analysis.

For example, when the rotation of an intensity pattern is taken into consideration, a Euclidean distance D can be obtained by equation (2) below.

$$D = \sqrt{\sum_{i=1}^{n} (a_r - b_i)^2} \quad (2)$$

Since r is expressed as r=i+j when i+j≤n and as r=i+j−n when i+j>n and an intensity pattern rotates when j is changed to 1 to n, a pattern analysis which takes rotation into consideration can be performed. While the analyzed intensity pattern is rotated in this case, the reference intensity pattern may be rotated instead. For example, the pattern analyzing unit 33 calculates the Euclidean distance D starting with j=1, and when a value of D exceeds a predetermined value, increments j by 1 and once again calculates the Euclidean distance D. This calculation is continued up to j=16. The pattern analyzing unit 33 changes j between 1 and 16, and when the value of the Euclidean distance D is equal to or smaller than a predetermined value, ends the calculation and determines that the pixel to be analyzed has a same crystal orientation as the reference intensity pattern, but when the value of the Euclidean distance D is not equal to or smaller than the predetermined value, evaluates a similarity of patterns using a minimum value of the Euclidean distances D within a range of 1≤j≤16.

Figure 20:
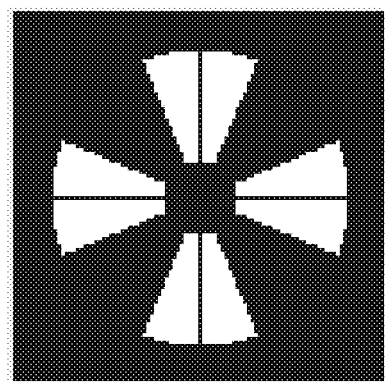
FIG. 20 is a diagram illustrating signal intensities of detection regions.
Figure 21:
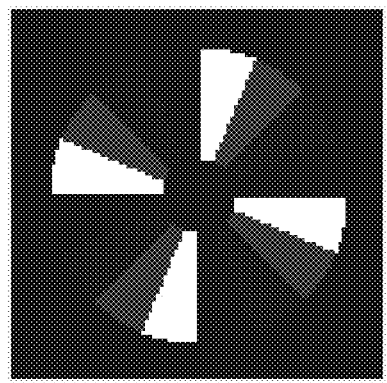
FIG. 21 is a diagram illustrating signal intensities of detection regions.

When m is a decimal number such as when $\phi_d > \phi_p$, there is a possibility that the analyzed intensity pattern may not become consistent with the reference intensity pattern even when rotated. This may occur particularly when the number of detection regions 9 is small. For example, when an electron beam is vertically incident to a specimen S with a crystal orientation of (100), an intensity distribution in a rotation direction of diffracted electrons incident to the electron detector 8 above the specimen S exhibits four-fold symmetry. Supposing that this intensity distribution is acquired with the electron detector 8 having 16 detection regions 9, a result illustrated in FIG. 20 is obtained in a given direction. In the electron detector 8 having 16 detection regions 9, since $\phi_d$ is 22.5 degrees, a result of acquiring an intensity distribution of diffracted electrons when the specimen S is rotated by 11.25 degrees is as illustrated in FIG. 21.

Since this resembles a shape obtained when integrating a detection signal in a rotation direction, when an angular width of the detection region 9 exceeds an amplitude of the intensity distribution of the diffracted electrons in the rotation direction, a signal amount changes significantly depending on a range of a detected intensity distribution.

In such a case, intensity patterns of a plurality of rotation angles of the specimen S may be registered in the database 26 as reference intensity patterns.

For example, when acquiring reference intensity patterns with the electron detector 8 having 16 detection regions 9, an intensity pattern when the rotation angle of the specimen S is 0 degrees is registered in the database 26 as a reference intensity pattern A, an intensity pattern when the rotation angle of the specimen S is 11.25 degrees is registered in the database 26 as a reference intensity pattern B, an intensity pattern when the rotation angle of the specimen S is 5.625 degrees is registered in the database 26 as a reference intensity pattern C, and an intensity pattern when the rotation angle of the specimen S is 16.875 degrees is registered in the database 26 as a reference intensity pattern D. When the intensity pattern at the analyzed position is consistent with any of the reference intensity patterns A, B, C, and D, the crystal orientation at the analyzed position is consistent with the crystal orientation of the reference intensity pattern A, B, C, or D.

In this manner, by registering a plurality of reference intensity patterns with different rotation angles in the database 26 with respect to a same crystal orientation, a crystal orientation can be specified even when a rotation angle of the crystal orientation differs.

In addition, while a crystal orientation is analyzed by generating an intensity pattern while scanning the specimen S with an electron probe in the description above, a scan by the electron probe need not be performed and a crystal orientation may be analyzed by causing an electron beam to be incident to one point on the specimen S and generating an intensity pattern.

2.2. Processes

Next, processes performed by the processing unit 30 of the electron microscope 200 will be described.

While an intensity pattern at an arbitrary pixel of a scanned image is used as a reference intensity pattern in the processes performed by the processing unit 30 of the electron microscope 100 described above, the processes performed by the processing unit 30 of the electron microscope 200 differ from the processes performed by the processing unit 30 of the electron microscope 100 in that a reference intensity pattern registered in the database 26 for each crystal orientation is used. Other points are similar to the processes performed by the processing unit 30 of the electron microscope 100 described above and a description thereof will be omitted.

In the electron microscope 200, since an intensity pattern obtained in a known crystal orientation of a specimen and registered in the database 26 is used as a reference intensity pattern, a determination of whether or not a crystal orientation at a pixel is the same as a crystal orientation of the reference intensity pattern can be made for each pixel. In addition, using a plurality of reference intensity patterns registered in the database 26 with mutually different crystal orientations enables various crystal orientations to be specified.

In the electron microscope 200, a crystal orientation specified in this manner may be displayed on a crystal orientation image.

2.3. Flow of Processes

Figure 22:
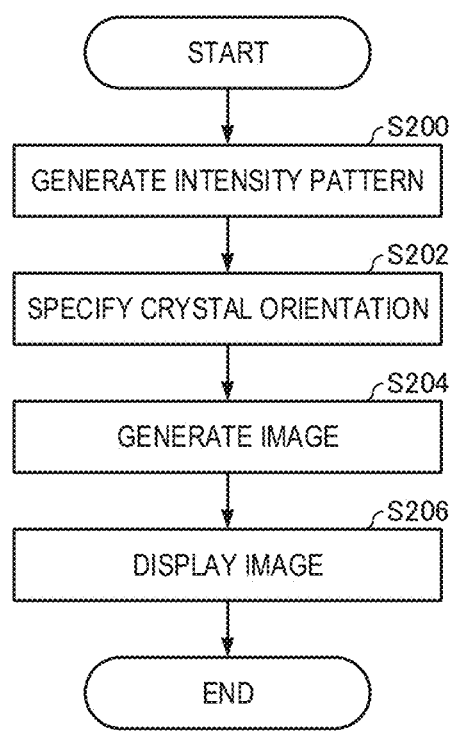
FIG. 22 is a flowchart illustrating an example of a flow of processes by a processing unit of the electron microscope according to the second embodiment.

Next, a flow of processes performed by the processing unit 30 of the electron microscope 200 according to the second embodiment will be described. FIG. 22 is a flowchart illustrating an example of the flow of processes by the processing unit 30 of the electron microscope 200 according to the second embodiment. The following description will focus on points that differ from the processes of the processing unit 30 of the electron microscope 100 illustrated in FIG. 16 described above, and a detailed description of similar points will be omitted.

The intensity pattern information generating unit 32 generates an intensity pattern based on intensities of first to n-th detection signals (S200).

The process S200 is performed in a similar manner to the process S100 described earlier.

Next, denoting an arbitrary pixel of a scanned image by (x, y) and an intensity pattern at the pixel by $a_{x,y}$, the pattern analyzing unit 33 specifies a crystal orientation of $a_{x,y}$ by comparing the reference intensity pattern registered in the database 26 with the generated intensity pattern (S202).

Specifically, a Euclidean distance to the reference intensity pattern b registered in the database 26 is calculated and, when the Euclidean distance is shorter than a predetermined value, the crystal orientation at the pixel is determined to be the same as the crystal orientation of the reference intensity pattern.

The pattern analyzing unit 33 may perform a process of specifying a crystal orientation using a plurality of reference intensity patterns with different crystal orientations. Specifically, let b1, b2, ..., bm denote m-number of reference intensity patterns registered in the database 26 and D1, D2, ..., Dm denote Euclidean distances between the intensity pattern $a_{x,y}$ and the reference intensity patterns b1, b2, ..., bm.

The pattern analyzing unit 33 first calculates the Euclidean distance D1 between the intensity pattern $a_{x,y}$ and the reference intensity pattern b1. The Euclidean distances D2, ..., Dm to the registered reference intensity patterns b2, ..., bm are calculated in a similar manner, a Euclidean distance shorter than a predetermined value is extracted from the obtained Euclidean distances D1, ..., Dm, a crystal orientation at the position is determined to be the same as the crystal orientation of the reference intensity pattern, and orientation information associated with the reference intensity pattern is output. In addition, the pattern analyzing unit 33 may perform a process of specifying a crystal orientation using a plurality of reference intensity patterns with different rotation angles.

Next, the image generating unit 34 generates a crystal orientation image based on the orientation information generated by the pattern analyzing unit 33 (S204). Based on the orientation information generated by the pattern analyzing unit 33, the image generating unit 34 determines pixel information such as a color, a brightness, and the like corresponding to the crystal orientation and generates an image.

The image generating unit 34 performs control for causing the generated image to be displayed by the display unit 22 (S206). At this point, for example, the image generating unit 34 may cause the information on the specified crystal orientation to be displayed on the generated image.

2.4. Features

For example, the electron microscope 200 has the following features.

In the electron microscope 200, the pattern analyzing unit 33 acquires reference intensity pattern information from the database 26 in which a reference intensity pattern is registered for each crystal orientation. Therefore, in the electron microscope 200, a crystal orientation can be readily specified.

In the electron microscope 200, the pattern analyzing unit 33 specifies a crystal orientation by comparing a reference intensity pattern registered in the database 26 with a generated intensity pattern and the image generating unit 34 generates a crystal orientation image based on the specified crystal orientation. Therefore, in the electron microscope 200, a crystal orientation of a crystalline particle can be readily specified.

2.5. Modification

Next, a modification of the electron microscope 200 according to the second embodiment will be described.

While a crystal orientation is specified using reference intensity patterns of known crystal orientations registered in the database 26 in the embodiment described above, a method of specifying a crystal orientation is not limited thereto.

For example, in a (100) orientation of a cubic crystal, an intensity distribution of diffracted electrons exhibits four-fold symmetry but an intensity distribution of the diffracted electrons does not exhibit four-fold symmetry in other crystal orientations. Therefore, a (100) orientation can be determined when an intensity pattern exhibits four-fold symmetry. A specific description will be given below.

In the image generating unit 34, a periodicity of an acquired analyzed intensity pattern is analyzed by subjecting the analyzed intensity pattern to fast fourier transform (FFT). For example, when a result of an analysis enables a determination of four-fold symmetry to be made, a crystal orientation can be specified as a (100) orientation.

In the electron microscope 200, for example, a crystal orientation is specified from an analyzed intensity pattern generated by the intensity pattern information generating unit 32 while scanning a specimen S with an electron probe. At this point, the image generating unit 34 performs a process of highlighting pixels a crystal orientation of which has been specified and displaying the highlighted pixels. Specification of a crystal orientation based on periodicity of an analyzed intensity pattern only allows orientations with characteristic intensity patterns to be analyzed. However, the present method enables a crystal orientation to be swiftly and readily analyzed and, in addition, a database and the like need not be prepared in advance.

Although an intensity pattern is acquired and a crystal orientation is specified while scanning the specimen S with an electron probe in the description above, an intensity pattern may be acquired and a crystal orientation may be specified by causing an electron beam to irradiate one point on the specimen S.

In this modification, the pattern analyzing unit 33 specifies a crystal orientation of the specimen S based on symmetry of an intensity pattern. Therefore, a crystal orientation of the specimen S can be readily specified.

3. Third Embodiment 3.1. Electron Microscope

Figure 23:
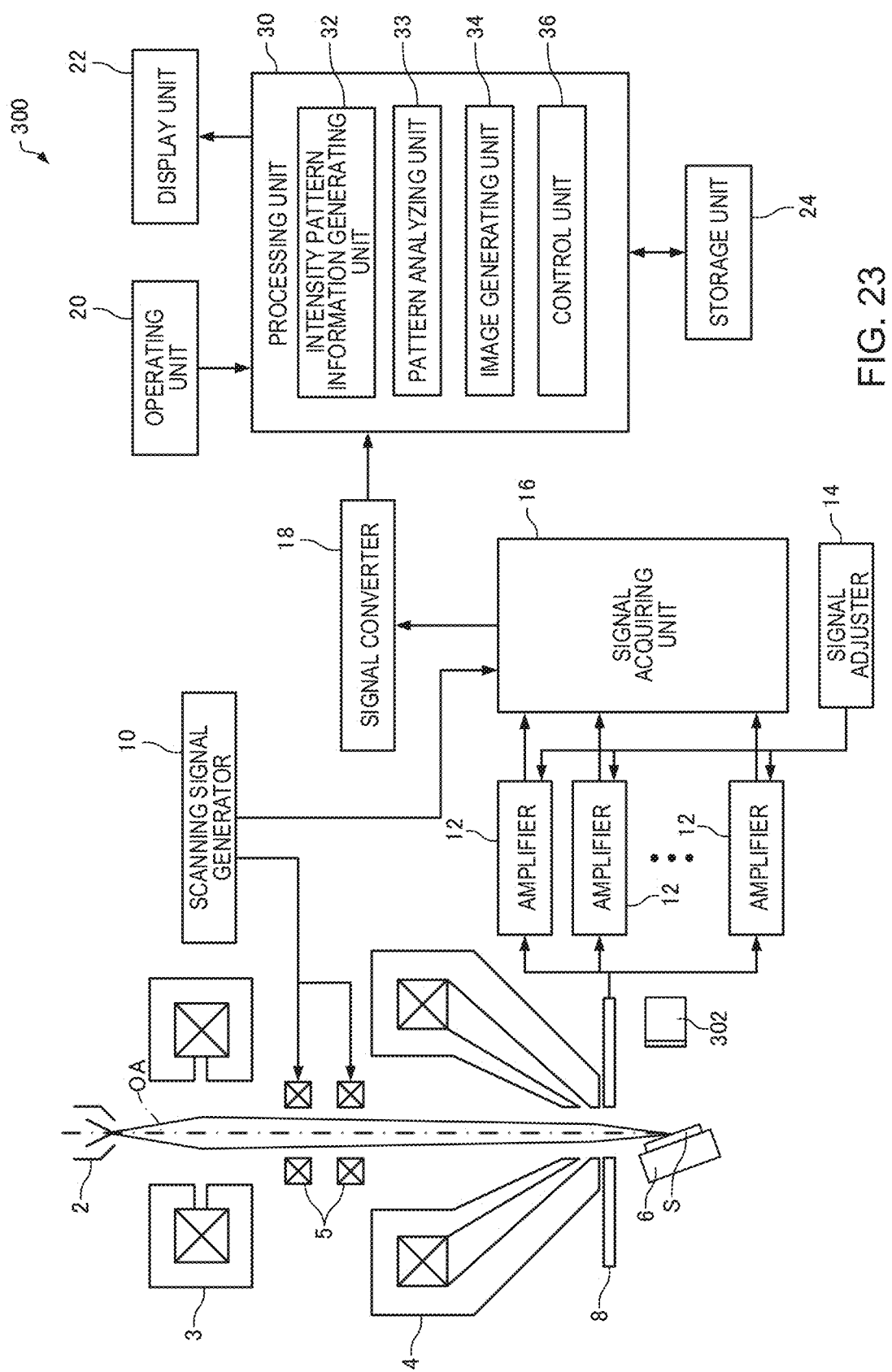
FIG. 23 is a diagram illustrating a configuration of an electron microscope according to a third embodiment.

Next, an electron microscope according to a third embodiment will be described with reference to the drawings. FIG. 23 is a diagram illustrating a configuration of an electron microscope 300 according to the third embodiment. Hereinafter, in the electron microscope 300 according to the third embodiment, members having similar functions to the components of the electron microscope 100 according to the first embodiment will be denoted by same reference characters and a detailed description thereof will be omitted.

In the second embodiment described above, a crystal orientation is specified using reference intensity patterns of known crystal orientations registered in the database 26.

By comparison, in the third embodiment, a crystal orientation is specified by measuring the crystal orientation using the EBSD method.

As illustrated in FIG. 23, the electron microscope 300 includes an EBSD detector 302. In addition, in the electron microscope 300, the processing unit 30 includes a control unit 36.

In the electron microscope 300, an electron beam is incident to a surface of a specimen S from an approximately 70-degree direction. The electrons incident to the specimen S are diffracted and emitted from the specimen S as backscattered electrons. A diffraction pattern (an EBSD pattern) which appears at this point is projected onto the EBSD detector 302 and the diffraction pattern is acquired by the EBSD detector 302. Information on the acquired diffraction pattern is sent to the processing unit 30.

When a diffraction pattern is acquired by the EBSD detector 302 as described above, the specimen S is greatly tilted with respect to the optical axis OA. By comparison, when detecting backscattered electrons with the electron detector 8, the specimen S is set horizontally and a measurement is performed in a similar state to the first embodiment (refer to FIG. 1).

Alternatively, a measurement may be performed by the electron detector 8 in a state where the specimen S is greatly tilted with respect to the optical axis OA. In this case, electrons emitted from the specimen S may hardly reach a position directly under the objective lens 4. Therefore, the electron detector 8 may be arranged at a position readily reachable by the electrons emitted from the specimen S.

In addition, in this configuration, the EBSD detector 302 may be used in place of the electron detector 8. Specifically, a two-dimensional array type detector is normally used as an EBSD detector and a signal is accepted as an image. The accepted image is divided into a plurality of areas, brightness in an area is integrated to obtain a signal amount, and an intensity pattern is generated by using the signal amount of each area.

The control unit 36 performs a process of controlling an optical system and the like of the electron microscope 300. For example, a measurement using the EBSD method is automatically performed by a process of the control unit 36.

3.2. Processes

Next, processes performed by the processing unit 30 of the electron microscope 300 will be described. In the electron microscope 300, a crystal orientation at each of pixels forming a pattern analysis image is specified based on a diffraction pattern acquired by the EBSD detector 302. In doing so, for each of the pixels forming the pattern analysis image, the pattern analyzing unit 33 compares an intensity pattern at the pixel with a reference intensity pattern and classifies the pixels into groups, acquires the diffraction pattern for each of the groups, and specifies a crystal orientation corresponding to each of the groups. A specific description of this process will be given below. The following description will focus on points that differ from the processes of the electron microscope 100 described above, and description of similar points will be omitted.

In the electron microscope 300, a signal intensity array s (x, y, z) is acquired by detecting emitted backscattered electrons with the electron detector 8 while scanning a surface of the specimen S with an electron probe in a similar manner to the first embodiment described above. In addition, the intensity pattern information generating unit 32 generates an intensity pattern with respect to each of the pixels forming a scanned image. An intensity pattern is stored in the storage unit 24 in correspondence with each of a plurality of the pixels forming the scanned image.

For example, the pattern analyzing unit 33 adopts an intensity pattern at an arbitrary pixel as a reference intensity pattern and, for all of the pixels forming the scanned image, obtains a Euclidean distance between the intensity pattern of the pixels and the reference intensity pattern. In addition, pixels of which the Euclidean distance is equal to or shorter than a predetermined value are grouped into a group G1 where group G=G1.

Next, an arbitrary pixel outside of the group G is selected and Euclidean distances are obtained at pixels outside of the group G while using the intensity pattern at the selected pixel as a reference intensity pattern. In addition, pixels of which the Euclidean distance is equal to or shorter than a predetermined value are grouped into a group G2 where group G=G∪G2.

Furthermore, an arbitrary pixel outside of the group G is selected and Euclidean distances are obtained using the intensity pattern at the selected pixel as a reference intensity pattern. In addition, pixels of which the Euclidean distance is equal to or shorter than a predetermined value are grouped into a group G3 where group G=G∪G3.

When groups of pixels with similar intensity patterns are successively added to the group G in this manner, all of the pixels are to ultimately belong to G and, when there are m-number of obtained groups, groups G1, G2, . . . , Gm are created.

In the description above, a process is repetitively performed in which Euclidean distances are obtained with respect to pixels outside of the group G and the pixels are grouped while using the intensity pattern at a pixel outside of the group G as a reference intensity pattern. By comparison, a process may be repetitively performed in which Euclidean distances are obtained with respect to all pixels forming the scanned image and the pixels are grouped while using the intensity pattern at a pixel outside of the group G as a reference intensity pattern.

Depending on an accuracy of pattern analysis and a variation in an intensity distribution of diffracted electrons, a pixel may end up belonging to a plurality of groups. In such a case, the pixel belonging to a plurality of groups is caused to belong to any one group and not to belong to a plurality of groups. In other words, 0=G1∩G2∩ . . . ∩Gm. For example, when there is a pixel belonging to a plurality of groups, a group of the pixel may be determined based on groups to which pixels surrounding the pixels belong. For example, the pixel may be considered to belong to a group to which a largest number of surrounding pixels belong or may be considered to belong to a group with a shortest Euclidean distance.

The pattern analyzing unit 33 acquires a diffraction pattern and specifies a crystal orientation for each of the obtained groups G1, G2, . . . , Gm. Specifically, the pattern analyzing unit 33 first specifies a region on the specimen S which corresponds to a pixel belonging to the group G1 and determines a measurement position inside the region. One measurement position or a plurality of measurement positions may be determined with respect to one group.

In addition, the control unit 36 controls the optical system of the electron microscope 100 based on information on the measurement position so that a diffraction pattern at the position is obtained. As a result, the diffraction pattern at the measurement position can be acquired by the EBSD detector 302. Furthermore, the pattern analyzing unit 33 specifies a crystal orientation of the group G1 from the obtained diffraction pattern. A similar process is performed for the other groups G2, . . . , Gm. As a result, crystal orientations can be specified for all pixels forming the pattern analysis image.

Based on the obtained crystal orientation information, the image generating unit 34 generates a crystal orientation image in which each pixel is set to a color and a brightness corresponding to the orientation.

It should be noted that, in the third embodiment, a process of pattern analysis is similar to that of the first embodiment and a description thereof will be omitted.

In the EBSD method, since a diffraction pattern is obtained by causing a high-accelerating voltage electron beam to be incident to a specimen plane from an oblique direction, a scattering region of electrons inside the specimen S increases. This results in a resolution of around several ten nm and makes it difficult to analyze crystalline particles with a particle size equal to or smaller than several ten nm.

By comparison, in the electron microscope 300, since low-accelerating voltage electrons are incident to a specimen plane from a vertical direction, a scattering region of the electrons is smaller as compared to a measurement by the EBSD method. This results in a resolution of around several nm. Therefore, in the electron microscope 300, a crystal orientation can be analyzed even with respect to a crystalline particle with a particle size of around several nm that is equal to or smaller than the resolution according to the EBSD method.

Specifically, a pattern analysis image is generated by the image generating unit 34 and a crystal orientation map is acquired by the EBSD method. In addition, the crystal orientation map acquired by the EBSD method and the pattern analysis image are associated with one another to specify crystal orientations of the pattern analysis image. In doing so, crystal orientations cannot be specified with respect to crystalline particles equal to or smaller than the resolution according to the EBSD method among crystalline particles included in the pattern analysis image.

Therefore, with respect to crystalline particles equal to or smaller than the resolution according to the EBSD method crystal orientations of which cannot be specified by the EBSD method among the crystalline particles included in the pattern analysis image, crystal orientations of the crystalline particles are specified based on intensity patterns of crystalline particles crystal orientations of which have been specified by the EBSD method.

Specifically, a database associating crystal orientations specified by the EBSD method and intensity patterns with each other is created from a pattern analysis image and a crystal orientation map by the EBSD method. In addition, with respect to an intensity pattern of a crystalline particle a crystal orientation of which cannot be specified by the EBSD method, Euclidean distances to intensity patterns registered in the database are calculated and a crystal orientation corresponding to an intensity pattern with a shortest Euclidean distance is adopted as the crystal orientation of the crystalline particle.

Accordingly, since orientations of crystalline particles of the pattern analysis image are specified, the image generating unit 34 generates a crystal orientation image based on the analysis result.

3.3. Flow of Processes

Figure 24:
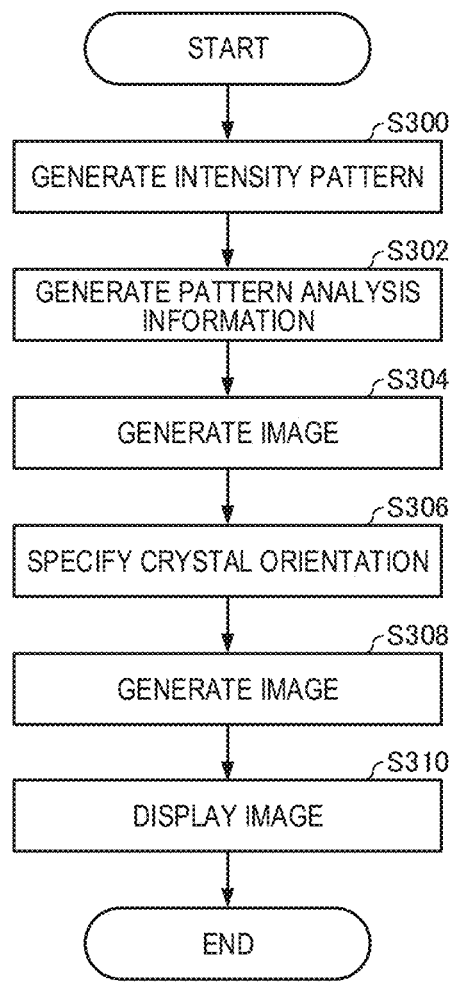
FIG. 24 is a flowchart illustrating an example of a flow of processes by a processing unit of the electron microscope according to the third embodiment.

Next, a flow of processes performed by the processing unit 30 of the electron microscope 300 according to the third embodiment will be described. FIG. 24 is a flowchart illustrating an example of the flow of processes by the processing unit 30 of the electron microscope 300 according to the third embodiment. The following description will focus on points that differ from the processes of the processing unit 30 of the electron microscope 100 illustrated in FIG. 16 described above, and a detailed description of similar points will be omitted.

The intensity pattern information generating unit 32 generates an intensity pattern based on intensities of first to n-th detection signals (S300).

The process S300 is performed in a similar manner to the process S100 described earlier.

Next, based on intensity patterns stored in the storage unit 24, the pattern analyzing unit 33 performs pattern analysis and generates pattern analysis information (S302), and the image generating unit 34 generates a pattern analysis image based on the pattern analysis information (S304).

Next, based on an analysis result of crystal orientations by the EBSD method, the pattern analyzing unit 33 specifies crystal orientations of crystalline particles included in the pattern analysis image (S306).

In doing so, for example, for each of the pixels forming the crystal orientation image, the pattern analyzing unit 33 may compare an intensity pattern at the pixel with a reference intensity pattern and group the pixels, acquire a diffraction pattern by the EBSD method for each group, and specify a crystal orientation corresponding to the group.

In addition, for example, based on an analysis result of crystal orientations obtained using a crystal orientation map by the EBSD method, the pattern analyzing unit 33 may specify crystal orientations of crystalline particles included in the pattern analysis image. Furthermore, a crystal orientation of a crystalline particle a crystal orientation of which cannot be specified using the crystal orientation map among the crystalline particles of the pattern analysis image may be specified based on intensity patterns of crystalline particles crystal orientations of which have been specified using the crystal orientation map.

Next, the image generating unit 34 generates a crystal orientation image in which each pixel is represented by a corresponding brightness and color based on the specified crystal orientations (S308).

Next, the image generating unit 34 performs control for causing the generated crystal orientation image and information on the specified crystal orientations to be displayed by the display unit 22 (S310).

3.4. Features

For example, the electron microscope 300 has the following features.

The electron microscope 300 includes the EBSD detector 302 which acquires a diffraction pattern (an EBSD pattern) obtained by irradiating a specimen S with an electron beam, and the pattern analyzing unit 33 specifies, based on the diffraction pattern, a crystal orientation at each of pixels forming a pattern analysis image. Therefore, in the electron microscope 300, the crystal orientation at each of pixels forming the pattern analysis image can be specified.

In the electron microscope 300, for each of the pixels forming the pattern analysis image, the pattern analyzing unit 33 compares an intensity pattern at the pixel with a reference intensity pattern and classifies the pixels into groups, acquires a diffraction pattern by the EBSD method for each of the groups, and specifies the crystal orientation in each of groups. Therefore, in the electron microscope 300, for example, the number of analyses by the EBSD method can be reduced as compared to when acquiring a crystal orientation map by the EBSD method.

In the electron microscope 300, the pattern analyzing unit 33 specifies crystal orientations of crystalline particles included in a pattern analysis image based on a diffraction pattern (for example, a crystal orientation map by the EBSD method), and specifies a crystal orientation of a crystalline particle a crystal orientation of which cannot be specified based on the diffraction pattern among the crystalline particles of the pattern analysis image based on intensity patterns of crystalline particles crystal orientations of which have been specified based on the diffraction pattern. Therefore, in the electron microscope 300, for example, a crystal orientation of a crystalline particle equal to or smaller than the resolution according to the EBSD method can be specified.

While a case where a crystal orientation of a crystalline particle included in a pattern analysis image is specified from an analysis result based on a diffraction pattern by the EBSD method has been described above, a method of specifying a crystal orientation is not particularly limited and a crystal orientation of a crystalline particle included in the pattern analysis image may be specified from an analysis result based on a diffraction pattern by the ECP method.

4. Fourth Embodiment

4.1. Electron Microscope

Figure 25:
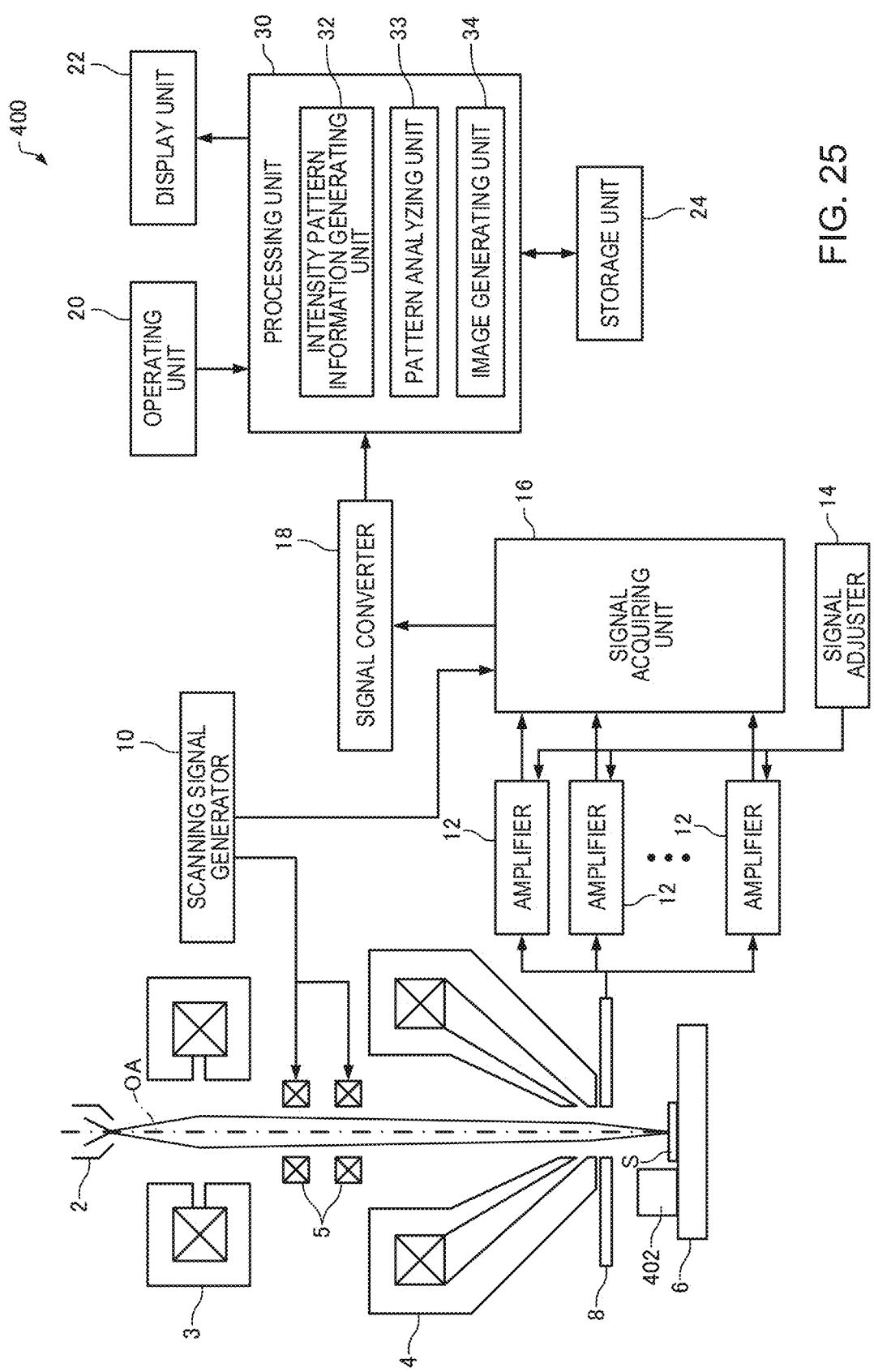
FIG. 25 is a diagram illustrating a configuration of an electron microscope according to a fourth embodiment.

Next, an electron microscope according to a fourth embodiment will be described with reference to the drawings. FIG. 25 is a diagram illustrating a configuration of an electron microscope 400 according to the fourth embodiment. Hereinafter, in the electron microscope 400 according to the fourth embodiment, members having similar functions to the components of the electron microscope 100 according to the first embodiment will be denoted by same reference characters and a detailed description thereof will be omitted.

As illustrated in FIG. 25, the electron microscope 400 is provided with a specimen load applying unit 402 which is capable of applying a load to a specimen S.

For example, the specimen load applying unit 402 has a mechanism which applies a force to the specimen S and which causes the specimen S to deform. In addition, for example, the specimen load applying unit 402 has a mechanism which applies heat to the specimen S.

Since the electron microscope 400 includes the specimen load applying unit 402, the electron microscope 400 is capable of acquiring an image while applying force to the specimen S and causing the specimen S to deform and acquiring an image while applying heat to the specimen S.

4.2. Processes

Next, processes performed by the processing unit 30 of the electron microscope 400 will be described. In the first embodiment described above, intensity patterns at a plurality of pixels forming a scanned image are obtained by one scan by an electron probe. In addition, at each pixel, the intensity pattern of the pixel and a reference intensity pattern are compared with each other and, based on a similarity thereof, a brightness of each pixel is calculated and a pattern analysis image is generated.

An electron microscope is sometimes used to observe a shape or a growth of a crystalline particle of the specimen S while applying a force to the specimen S and causing the specimen S to deform or while applying heat to the specimen S. In this case, scans by an electron probe are repetitively performed while applying a load such as heat or stress to the specimen S to acquire a plurality of continuous scanned images. Accordingly, a situation where the shape of the crystalline particle changes under the load applied to the specimen S can be observed.

Applying the method of generating a crystal orientation image described above to this observation method enables a shape of a crystalline particle and a change in a crystal orientation to be readily observed in an easy-to-understand manner.

In doing so, when repetitively performing scans by an electron probe in the electron microscope 400, a reference intensity pattern is shared or, in other words, a same intensity pattern is used as the reference intensity pattern. For example, if the reference intensity pattern is not shared when repetitively performing scans by the electron probe, a brightness of a pixel differs between a crystal orientation image obtained by a first scan and a crystal orientation image obtained by a second scan even when a same intensity pattern is obtained at the pixel.

For example, when an intensity pattern at an arbitrary pixel (for example, a pixel positioned at a center of a field of view) of a scanned image obtained by one scan is adopted as the reference intensity pattern, repetitively performing scans may cause the reference intensity pattern to change due to distortion of a crystalline particle corresponding to the pixel or due to a change in crystal orientation. Therefore, when repetitively performing scans by an electron probe in the electron microscope 400, a reference intensity pattern is shared. A specific description of this method will be given below. In addition, the following description will focus on points that differ from the processes of the electron microscope 100 described above, and description of similar points will be omitted.

There are two conceivable times when the reference intensity pattern is set: before applying a load to the specimen S (before a load test); and after applying a load to the specimen S (after a load test).

First, a case where the reference intensity pattern is set before a load test will be described. By setting the reference intensity pattern before applying a load to the specimen S, a change in a state of the specimen S can be confirmed in real time while the load is being applied to the specimen S. This approach is effective when, for example, observing a change while applying a load with a focus on a certain orientation to a specimen S a crystal orientation of which is known in advance by the EBSD method or the like.

Before the load test, one scan's worth of data is acquired. In other words, intensity patterns at all pixels forming a scanned image corresponding to one scan are acquired. A reference intensity pattern is acquired from data of the acquired intensity patterns. As the reference intensity pattern, an intensity pattern at an arbitrary pixel (for example, a pixel at a center of a field of view) may be automatically selected or a scanned image may be generated from data of the acquired intensity patterns and the user may be able to select a pixel for acquiring the reference intensity pattern from the scanned image.

Alternatively, when focusing on a change in a specific crystal orientation and an intensity pattern at the crystal orientation is known in advance, the intensity pattern may be adopted as the reference intensity pattern.

Alternatively, an intensity pattern at an arbitrary pixel may be acquired and adopted as a tentative reference intensity pattern and, after generating a tentative pattern analysis image using the tentative reference intensity pattern to make a crystalline particle more readily observable, a pixel for acquiring the reference intensity pattern may be specified from the tentative pattern analysis image.

The set reference intensity pattern is stored in the storage unit 24. It should be noted that that the reference intensity pattern may be set in plurality.

Next, a load is applied to the specimen S and electrons are detected by the plurality of detection regions 9 while scanning a surface of the specimen S with an electron probe. In addition, for each of the pixels forming the scanned image, the pattern analyzing unit 33 compares the determined reference intensity pattern with an intensity pattern based on intensities of first to n-th detection signals, and the image generating unit 34 generates a pattern analysis image based on an analysis result by the pattern analyzing unit 33. The image generating unit 34 performs a process of respectively storing a pattern analysis image generated by a first scan after applying the load to the specimen S, a pattern analysis image generated by a second scan after applying the load to the specimen S, and so on in the storage unit 24 in association with information on the number of scans.

As a result, a situation where the shape of a crystalline particle or a crystal orientation of interest changes under a load applied to the specimen S can be observed from the plurality of obtained pattern analysis images.

In addition, by performing these processes while performing a load test and causing a latest obtained pattern analysis image to be displayed on the display unit 22, for example, a situation of a crystalline particle of a specimen can be observed and, at the same time, a magnitude of the load can be varied accordingly.

Next, a case where the reference intensity pattern is determined after a load test will be described.

A load test is started while scanning a surface of the specimen S with an electron probe and electrons are detected by the plurality of detection regions 9. Subsequently, data (hereinafter, also referred to as "scan data") of a signal amount of the first to n-th detection signals obtained in a first scan and associated with the incidence position of the electron beam, scan data obtained in a second scan, and so on are stored in the storage unit 24 in association with information on the number of scans. At this point, the display unit 22 may be caused to display a scanned image based on a sum of intensities of the first to n-th detection signals.

Since a data amount increases as the number of scans increases, the scan data may be subjected to compression transform.

After the load test, the pattern analyzing unit 33 can read out scan data from the storage unit 24 and analyze the scan data, sequentially generate pattern analysis images using the image generating unit 34, and have the display unit 22 display the pattern analysis images.

In this manner, based on scan data stored in the storage unit 24, a pattern analysis image can be generated and displayed for each scan by the electron probe. In this case, when there is a crystalline particle of interest to the user, by specifying the crystalline particle, an intensity pattern of the crystalline particle at the time point is adopted as the reference intensity pattern. Accordingly, a change in the crystalline particle specified by the user can be observed.

It should be noted that combining these two methods enables a reference intensity pattern to be set before a load test, scan data to be recorded while generating pattern analysis images in real time, a reference intensity pattern to be set once again after the load test, and a pattern analysis image to be generated and displayed on the display unit 22.

Alternatively, a crystal orientation may be specified from an analysis result obtained by the pattern analyzing unit 33 using an intensity pattern with which a crystal orientation is associated as a reference intensity pattern and a crystal orientation image may be generated by the image generating unit 34.

4.3. Features

For example, the electron microscope 400 has the following features.

In the electron microscope 400, the image generating unit 34 generates a plurality of pattern analysis images in accordance with a plurality of scans of a specimen S by an electron probe, and a reference intensity pattern is shared among the plurality of pattern analysis images. Therefore, in the electron microscope 400, a change in crystallinity of the specimen S can be obtained as described above.

For example, in the electron microscope 400, by repetitively scanning the specimen S with the electron probe while applying heat to the specimen S and acquiring a plurality of pattern analysis images, a phase transformation of the specimen S can be observed. Furthermore, a temperature of the phase transformation can be specified by monitoring a temperature of the specimen S.

5. Fifth Embodiment

5.1. Electron Microscope

Figure 26:
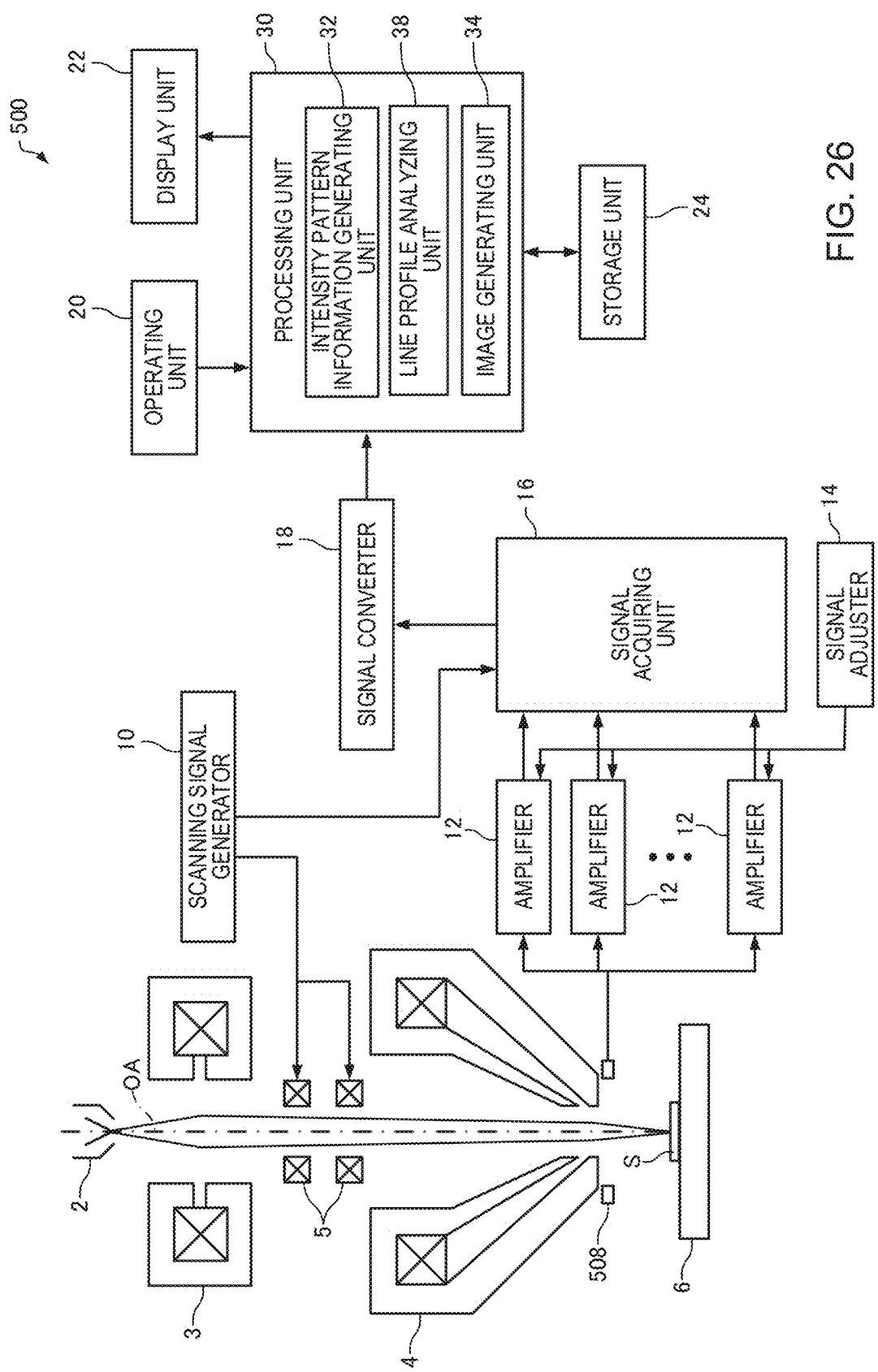
FIG. 26 is a diagram illustrating a configuration of an electron microscope according to a fifth embodiment.
Figure 27:
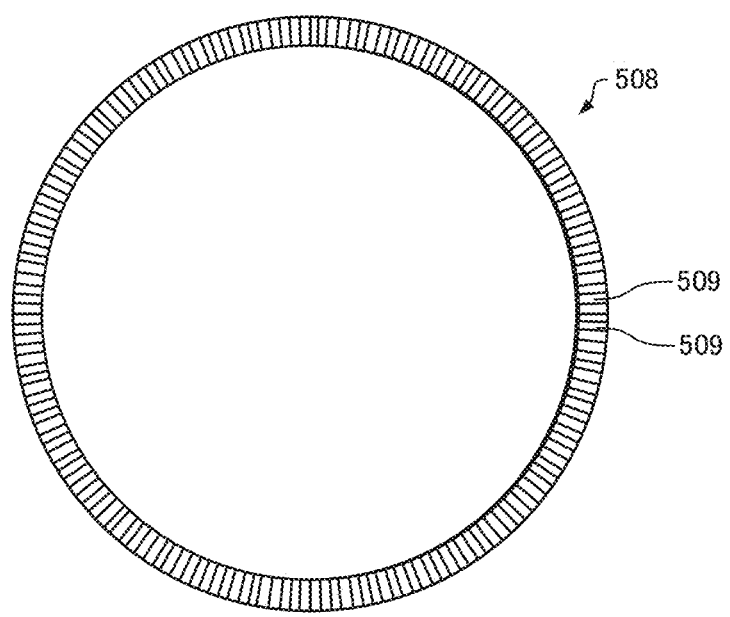
FIG. 27 is a plan view schematically illustrating an electron detector.

Next, an electron microscope according to a fifth embodiment will be described with reference to the drawings. FIG. 26 is a diagram illustrating a configuration of an electron microscope 500 according to the fifth embodiment. FIG. 27 is a plan view schematically illustrating an electron detector 508.

Hereinafter, in the electron microscope 500 according to the fifth embodiment, members having similar functions to the components of the electron microscope 100 according to the first embodiment will be denoted by same reference characters and a detailed description thereof will be omitted.

As illustrated in FIG. 27, in the electron microscope 500, the electron detector 508 is configured such that n'-number of detection regions 509 (examples of a detecting unit) are linearly arranged, where n' is an integer equal to or larger than 2.

The intensity pattern information generating unit 32 illustrated in FIG. 26 generates an intensity line profile as intensity pattern information based on intensities of n'-number of detection signals output from the n'-number of detection regions 509. The processing unit 30 includes a line profile analyzing unit 38 which specifies a crystal orientation based on an intensity line profile generated by the intensity pattern information generating unit 32.

As illustrated in FIG. 27, the electron detector 508 is a segmented detector having the n'-number of detection regions 509. In the illustrated example, the n'-number of detection regions 509 are arranged along a circle. The detection regions 509 are respectively individually capable of detecting electrons in a similar manner to the detection regions 9 illustrated in FIG. 2 described above. As many detection regions 509 as necessary to obtain a line profile of a diffraction pattern to be described later are arranged.

In the electron microscope 500, an area of one detection region 509 is smaller than the area of the detection region 9 of the electron detector 8 illustrated in FIG. 2. While the area of one detection region 9 illustrated in FIG. 2 is larger than, for example, a width of a Kikuchi line formed on a plane on which the electron detector 508 is arranged, the area of one detection region 509 illustrated in FIG. 27 is smaller than the width of a Kikuchi line. The area of one detection region 509 is favorably sufficiently smaller than the width of a Kikuchi line so that a Kikuchi line can be specified.

The electron detector 508 is configured so as to include, for example, n'-number of photodiodes arranged along a circle. The n'-number of photodiodes correspond to the n'-number of detection regions 509. The electron detector 508 may be configured such that optical fibers with a fluorescent coating applied to front ends thereof are arranged along a circle and a photodetector is connected to rear ends thereof. As the photodetector, a photodiode, a photomultiplier tube, or the like can be used.

Figure 28:
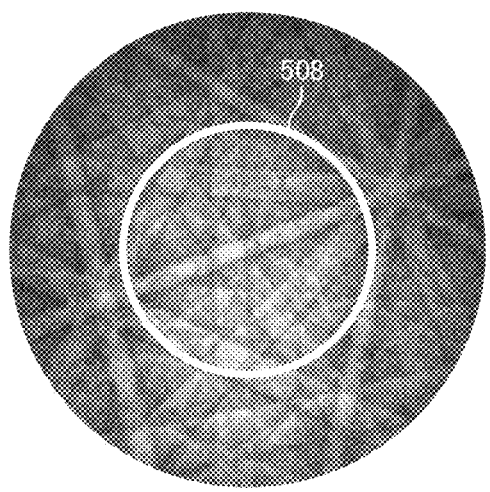
FIG. 28 is a diagram illustrating a relationship between a diffraction pattern and an electron detector.

FIG. 28 is a diagram illustrating a relationship between a diffraction pattern formed on the plane on which the electron detector 508 (the detection regions 509) are arranged and the electron detector 508. In FIG. 28, the n'-number of detection regions 509 are represented by lines for the sake of convenience. The lines formed by the n'-number of detection regions 509 are also referred to as detection lines.

As illustrated in FIG. 28, electrons incident to the specimen S are scattered inside the specimen S and are then diffracted by a lattice plane of a crystal. The electrons (backscattered electrons) subjected to diffraction are emitted from the specimen S and a diffraction pattern is formed on the plane on which the electron detector 8 is arranged. In this case, a Kikuchi pattern is produced by a Bragg reflection (elastic scattering) of electrons incident to the specimen S after being inelastically scattered inside the crystalline specimen due to thermal vibrations of atoms. Since directions of travel of inelastically scattered electrons are distributed across a wide angle, a pair of a bright line and a dark line due to reflections off of a front surface and a rear surface of a given crystalline surface is created at a Bragg reflection position. The pair of a bright line and a dark line is referred to as a Kikuchi line.

As illustrated in FIG. 28, the n'-number of detection regions 509 are linear and are configured so as to intersect a plurality of Kikuchi lines. Therefore, with the n'-number of detection regions 509, a line profile (hereinafter, also referred to as an "intensity line profile") along a line along which the n'-number of detection regions 509 are arranged can be acquired. The intensity line profile represents a brightness on the detection line (an intensity of the Kikuchi line).

5.2. Processes

Next, processes performed by the processing unit 30 of the electron microscope 500 will be described. In the electron microscope 500, the intensity pattern information generating unit 32 generates an intensity line profile as intensity pattern information based on intensities of n'-number of detection signals output from the n'-number of detection regions 509. The line profile analyzing unit 38 specifies a crystal orientation based on the intensity line profile. The following description will focus on points that differ from the processes of the electron microscope 100 described above, and description of similar points will be omitted.

5.2.1. Generation of Line Profile

The intensity pattern information generating unit 32 generates an intensity line profile as intensity pattern information based on intensities of n'-number of detection signals output from the n'-number of detection regions 509.

The intensity line profile to be analyzed can be acquired by irradiating a point (hereinafter, also referred to as an "analysis point") where an analysis of a crystal orientation is to be performed on the specimen S with an electron beam and detecting electrons having been scattered and diffracted by the specimen S and emitted from the specimen S by the electron detector 508.

Figure 29:
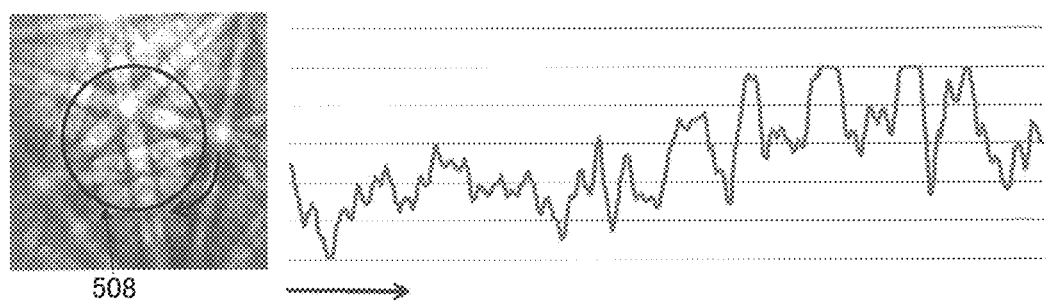
FIG. 29 is a diagram illustrating an example of an intensity line profile.

FIG. 29 is a diagram illustrating an example of an intensity line profile.

In the intensity line profile, an abscissa represents a position on a diffraction pattern and an ordinate represents an intensity (in other words, brightness) of the diffraction pattern. In the illustrated example, since the n'-number of detection regions 509 are arranged along a circle, the intensity line profile is a profile of intensities along the circle on the diffraction pattern. The area of one detection region 509 is sufficiently smaller than the width of a Kikuchi line. Therefore, a peak corresponding to a bright line and a bottom corresponding to a dark line of a Kikuchi line are visible in the intensity line profile.

5.2.2. Generation of Reference Line Profile

The line profile analyzing unit 38 obtains a diffraction pattern of the specimen S by a calculation (simulation) and generates a line profile (hereinafter, also referred to as a "reference line profile") from the obtained diffraction pattern. In the fifth embodiment, a crystal orientation is specified by comparing the intensity line profile obtained using the n'-number of detection regions 509 with the line profile (the reference line profile) generated from the diffraction pattern obtained by a simulation.

The diffraction pattern can be obtained by a simulation. Specifically, the diffraction pattern can be calculated using a known method from, for example, an element forming a crystal and a crystal structure thereof and from an energy level of the electrons incident to the specimen S.

For example, knowing a shape and a position of a detection line may suffice in order to generate a reference line profile from the diffraction pattern obtained by a simulation.

The shape and the position of a detection line can be assessed from the shapes and positions of the n'-number of detection regions 509 and a distance between the plane on which the n'-number of detection regions 509 are arranged and the specimen S. These pieces of information can be acquired from apparatus design information. Therefore, in the electron microscope 500, the information is stored in the storage unit 24 in advance.

Figure 30:
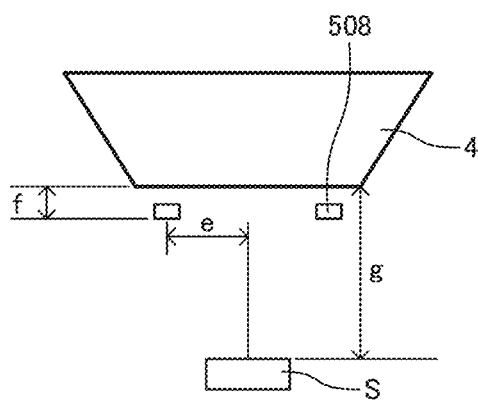
FIG. 30 is a diagram for describing a method of obtaining a reference line profile.
Figure 31:
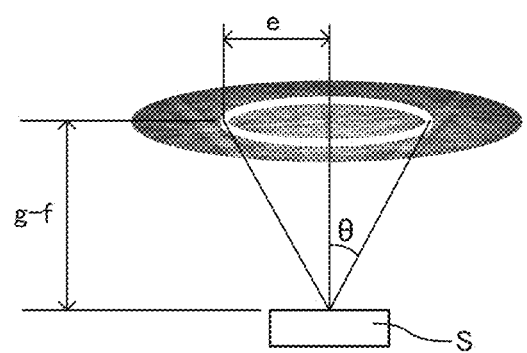
FIG. 31 is a diagram for describing a method of obtaining a reference line profile.

FIGS. 30 and 31 are diagrams for describing a method of obtaining a reference line profile.

For example, as illustrated in FIG. 30, when the electron detector 508 with a radius of e is arranged under the objective lens 4 at a position where a distance between the objective lens 4 and the electron detector 508 is f, if an operating distance is denoted by g, a distance between the specimen S and the electron detector 508 is expressed as a distance g-f. Consequently, the electron detector 508 is to acquire a signal on a line with an angle $\theta = \tan^{-1}(e/(g-f))$ on the diffraction pattern. Therefore, a reference line profile can be generated by acquiring a profile on a line satisfying this angle $\theta$ from the diffraction pattern obtained by a simulation.

The diffraction pattern is calculated for various crystal orientations and a reference line profile is generated for each crystal orientation. The crystal orientations and the reference line profiles are associated with each other and stored in the storage unit 24. In this manner, a database of crystal orientations of a specimen to be analyzed and reference line profiles can be generated.

It should be noted that, since a diffraction pattern differs depending on measurement conditions, databases may be created in advance by calculating diffraction patterns under various measurement conditions and a database suitable for measurement conditions may be read out and used.

5.2.3. Analysis

The line profile analyzing unit 38 specifies a crystal orientation by comparing the intensity line profile generated by the intensity pattern information generating unit 32 and the reference line profiles with each other.

The intensity line profile generated by the intensity pattern information generating unit 32 is compared with the reference line profiles in the database, and a crystal orientation associated with the reference line profile with the most similarly shaped profile is adopted as the crystal orientation at the analysis point.

The comparison of the intensity line profile at the analysis point and the reference line profiles of the database can be performed by, for example, a calculation using Euclidean distances. The Euclidean distances between the intensity line profile and the reference line profiles can be obtained by a calculation (refer to equation (1) or equation (2)) similar to that when obtaining the Euclidean distance D of an intensity pattern described above.

It should be noted that the comparison of the intensity line profile and the reference line profiles is not limited to a method that uses Euclidean distances. For example, positions and widths of a Kikuchi line in the diffraction pattern obtained by a simulation may be registered in a database, and a position and a width of a Kikuchi line may be estimated from the intensity line profile and compared by searching the database. According to this method, since there is no need to obtain an intensity of a diffraction pattern by a simulation, a database can be more readily created.

An analysis result of the crystal orientation at the analysis point obtained in this manner is displayed on the display unit 22.

5.3. Flow of Processes

Figure 32:
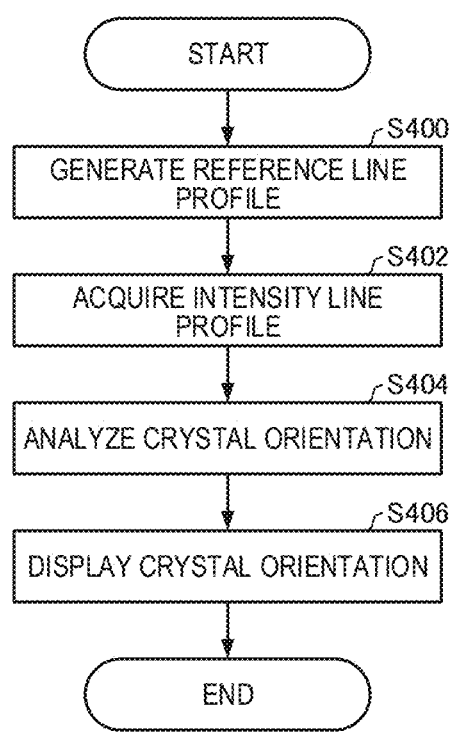
FIG. 32 is a flowchart illustrating an example of a flow of processes by a processing unit of the electron microscope according to the fifth embodiment.

Next, a flow of processes performed by the processing unit 30 of the electron microscope 500 according to the fifth embodiment will be described. FIG. 32 is a flowchart illustrating an example of the flow of processes by the processing unit 30 of the electron microscope 500 according to the fifth embodiment. The following description will focus on points that differ from the processes of the processing unit 30 of the electron microscope 100 illustrated in FIG. 16 described above, and a detailed description of similar points will be omitted.

First, the line profile analyzing unit 38 generates a database of crystal orientations of a specimen to be analyzed and reference line profiles (S400). When the user inputs, via the operation unit 20, a composition and a crystal structure of a specimen to be analyzed, the line profile analyzing unit 38 generates reference line profiles of various crystal orientations in the specimen to be analyzed and registers the generated reference line profiles in association with the crystal orientations to the database. The database is stored in the storage unit 24.

Next, the intensity pattern information generating unit 32 generates an intensity line profile at an analysis point based on intensities of n'-number of detection signals output from the n'-number of detection regions 509 (S402).

Next, the line profile analyzing unit 38 specifies a crystal orientation by comparing the intensity line profile at the analysis point and the reference line profiles with each other (S404).

The image generating unit 34 performs control for causing information on the specified crystal orientation to be displayed by the display unit 22 (S406).

5.4. Features

For example, the electron microscope 500 has the following features.

In the electron microscope 500, the intensity pattern information generating unit 32 generates an intensity line profile based on intensities of a plurality of detection signals output from the plurality of detection regions 509. Therefore, with the electron microscope 500, information on crystallinity of the specimen S can be readily obtained in a similar manner to the electron microscope 100 described above.

In addition, with the electron microscope 500, since a measurement can be performed by detecting backscattered electrons with the electron detector 508 provided with a plurality of detection regions 509, a measurement can be performed within a shorter period of time as compared to, for example, measurements by the EBSD method and the ECP method.

In the electron microscope 500, the line profile analyzing unit 38 specifies a crystal orientation based on the intensity line profile. Therefore, information on crystallinity of the specimen S can be readily obtained.

In the electron microscope 500, the line profile analyzing unit 38 obtains, by a calculation, a diffraction pattern obtained by irradiating a specimen S with an electron beam, generates a reference line profile to be used as a reference from the obtained diffraction pattern, and specifies a crystal orientation by comparing an intensity line profile with the reference line profile. Therefore, information on crystallinity of the specimen S can be readily obtained.

5.5. Modifications

Next, modifications of the electron microscope 500 according to the fifth embodiment will be described.

5.5.1. First Modification

Figure 33:
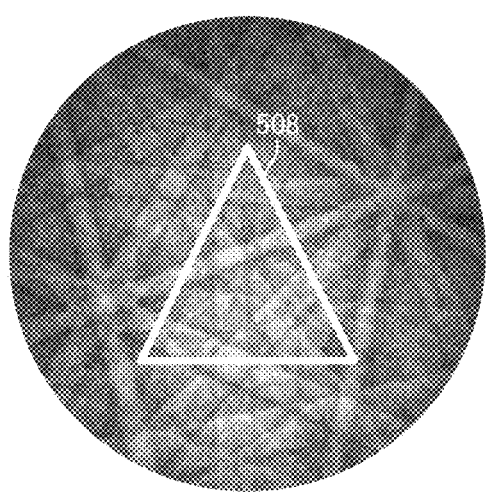
FIG. 33 is a diagram for describing a modification of an electron detector.
Figure 34:
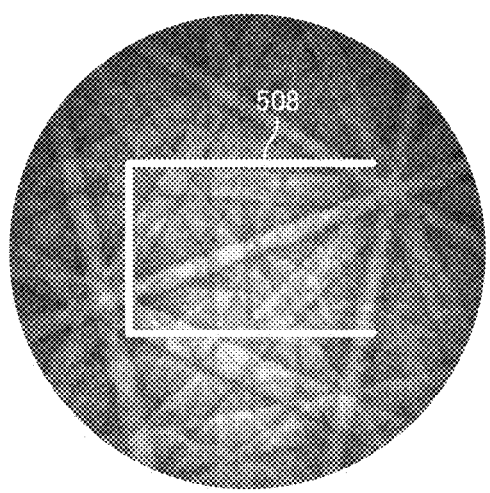
FIG. 34 is a diagram for describing a modification of an electron detector.

FIGS. 33 and 34 are diagrams for describing a modification of the electron detector 508. FIGS. 33 and 34 correspond to FIG. 28.

For example, while the electron detector 508 described above represents a case where n'-number of detection regions 509 are arranged along a circle and a detection line is a circle as illustrated in FIGS. 27 and 28, for example, the n'-number of detection regions 509 may be arranged along a polygon (a triangle in the illustrated example) and a detection line may be a polygon as illustrated in FIG. 33. In addition, as illustrated in FIG. 34, a detection line created by the n'-number of detection regions 509 need not be a closed curve. In the electron detector 508 illustrated in FIG. 34, the n'-number of detection regions 509 are arranged along two parallel lines and a line connecting ends of the two lines, and the detection line is a shape formed by these lines.

It should be noted that, in the case illustrated in FIG. 28 in which the detection line is a circle, Euclidean distances can be obtained using equation (2) even when the intensity line profile is rotated. However, with the detection line illustrated in FIGS. 33 and 34, Euclidean distances cannot be obtained using equation (2). Therefore, line profiles of various rotation angles are to be registered in the database in advance.

5.5.2. Second Modification

Figure 35:
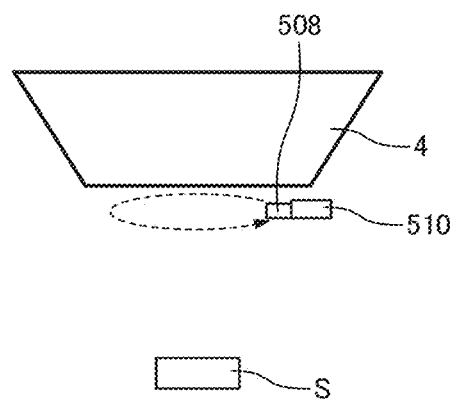
FIG. 35 is a diagram for describing a modification of an electron detector.

FIG. 35 is a diagram for describing a modification of the electron detector 508.

For example, while the electron detector 508 illustrated in FIG. 27 described above is configured so as to include n'-number of detection regions 509, the electron detector 508 illustrated in FIG. 35 is configured so as to include one detection region 509 and a moving mechanism 510 which moves the detection region 509.

In the illustrated example, the moving mechanism 510 moves the detection region 509 along a circle. By having the detection region 509 detect backscattered electrons while moving a position of the detection region 509 with the moving mechanism 510, an intensity line profile similar to that of the electron detector 508 illustrated in FIG. 27 can be obtained. The intensity pattern information generating unit 32 generates an intensity line profile based on, for example, a position of the detection region 509 and an intensity of a detection signal at the position.

Alternatively, the moving mechanism 510 may move the detection region 509 along the detection line illustrated in FIG. 33 or the detection line illustrated in FIG. 34.

5.5.3. Third Modification

While a case of analyzing a crystal orientation at an analysis point is described in the fifth embodiment above, moving the analysis point enables a crystal orientation image indicating a distribution of crystal orientations of the specimen S to be generated in a similar manner to the electron microscope 100 according to the first embodiment described above. In this case, since information and measurement conditions of the specimen S are the same, analyses of crystal orientations can be performed by using a same database at all of the analysis points.

6. Sixth Embodiment

6.1. Electron Microscope

Figure 36:
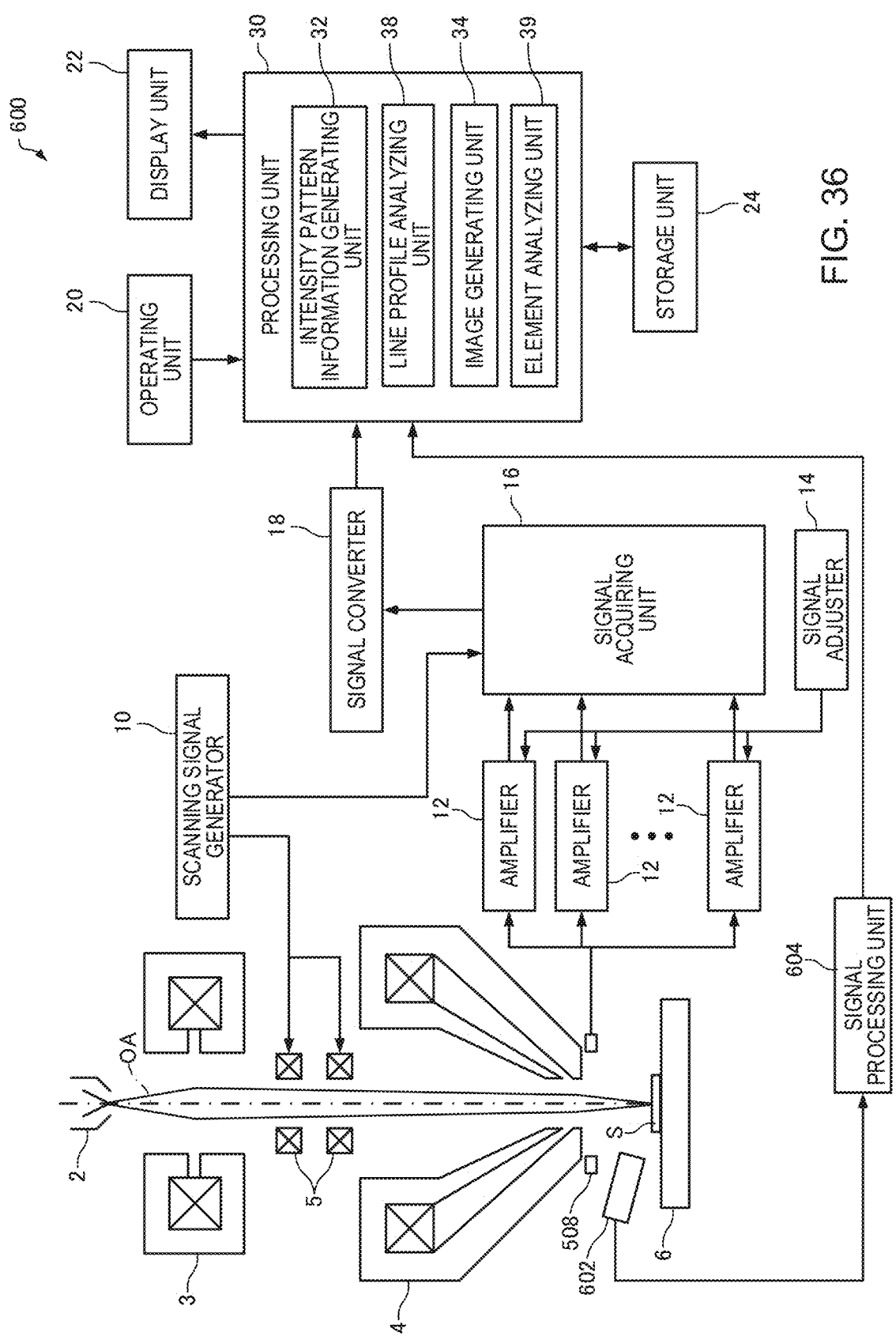
FIG. 36 is a diagram illustrating a configuration of an electron microscope according to a sixth embodiment.

Next, an electron microscope according to a sixth embodiment will be described with reference to the drawings. FIG. 36 is a diagram illustrating a configuration of an electron microscope 600 according to the sixth embodiment. Hereinafter, in the electron microscope 600 according to the sixth embodiment, members having similar functions to the components of the electron microscope 500 according to the fifth embodiment will be denoted by same reference characters and a detailed description thereof will be omitted.

As illustrated in FIG. 36, the electron microscope 600 includes an X-ray detector 602 and a signal processing unit 604. In addition, in the electron microscope 600, the processing unit 30 includes an element analyzing unit 39.

While composition information of a specimen S is input by the user in the electron microscope 500 illustrated in FIG. 26 described above, in the electron microscope 600, composition information of a specimen S to be analyzed is acquired from a result of an elemental analysis performed by the X-ray detector 602.

The X-ray detector 602 is, for example, an energy-dispersive X-ray detector, a wavelength-dispersive X-ray detector, or the like. A signal output from the X-ray detector 602 is sent to the signal processing unit 604. In the signal processing unit 604, spectral data is generated based on the signal from the X-ray detector 602 and the spectral data is sent to the processing unit 30. The element analyzing unit 39 performs an elemental analysis based on the spectral data (EDS spectral data or WDS spectral data) from the signal processing unit 604.

6.2. Processes

In the electron microscope 600, the line profile analyzing unit 38 calculates a diffraction pattern based on a result of an elemental analysis using the X-ray detector 602.

First, X-rays generated by irradiating an analysis point with an electron beam are detected by the X-ray detector 602, an elemental analysis of the analysis point is performed by the element analyzing unit 39, and composition information as a result of the elemental analysis is acquired. Based on the composition information, the line profile analyzing unit 38 generates a reference line profile and registers the reference line profile in a database in a similar manner to the electron microscope 500. Other processes are similar to those of the electron microscope 500 and a description thereof will be omitted.

It should be noted that detection of X-rays at the analysis point by the X-ray detector 602 and detection of a diffraction pattern at the analysis point by the electron detector 508 may be performed concurrently. Alternatively, the detection of X-rays at the analysis point by the X-ray detector 602 may be performed first, and after determining measurement conditions (incidence energy and the like) to be applied when detecting a diffraction pattern from a result of the elemental analysis, the detection of the diffraction pattern by the electron detector 508 may be performed.

6.3. Features

For example, the electron microscope 600 has the following features.

The electron microscope 600 includes the X-ray detector 602 which detects X-rays generated by irradiating a specimen S with an electron beam, and the line profile analyzing unit 38 calculates a diffraction pattern based on a result of an elemental analysis using the X-ray detector 602. Therefore, in the electron microscope 600, information on a specimen can be accurately acquired and a reference line profile can be accurately generated.

For example, while the electron microscope 500 requires that composition information of the specimen be known to the user, the electron microscope 600 does not require such information to be known. Therefore, in the electron microscope 600, a crystal orientation can be readily analyzed.

In addition, in the electron microscope 600, since a crystal orientation can be analyzed using the electron detector 508, an analysis of a crystal orientation can be performed in a horizontal state without having to tilt the specimen S. Therefore, a result of the analysis of a crystal orientation is more readily matched with a result of an elemental analysis obtained by the X-ray detector 602.

For example, when specifying a crystal orientation of the specimen S by the EBSD method, the specimen S must be greatly tilted. However, the X-ray detector 602 cannot be used in a state where the specimen S is greatly tilted. Therefore, it is difficult to match an analysis result of a crystal orientation by the EBSD method which is acquired in a state where the specimen S is greatly tilted with a result of an elemental analysis using the X-ray detector 602 which is acquired in a horizontal state of the specimen S. By comparison, since the electron detector 508 can be used under conditions similar to those of the X-ray detector 602, such a problem does not occur.

It should be noted that the first to third modifications of the electron microscope 500 described above are also applicable to the electron microscope 600.

7. Seventh Embodiment

7.1. Electron Microscope

Figure 37:
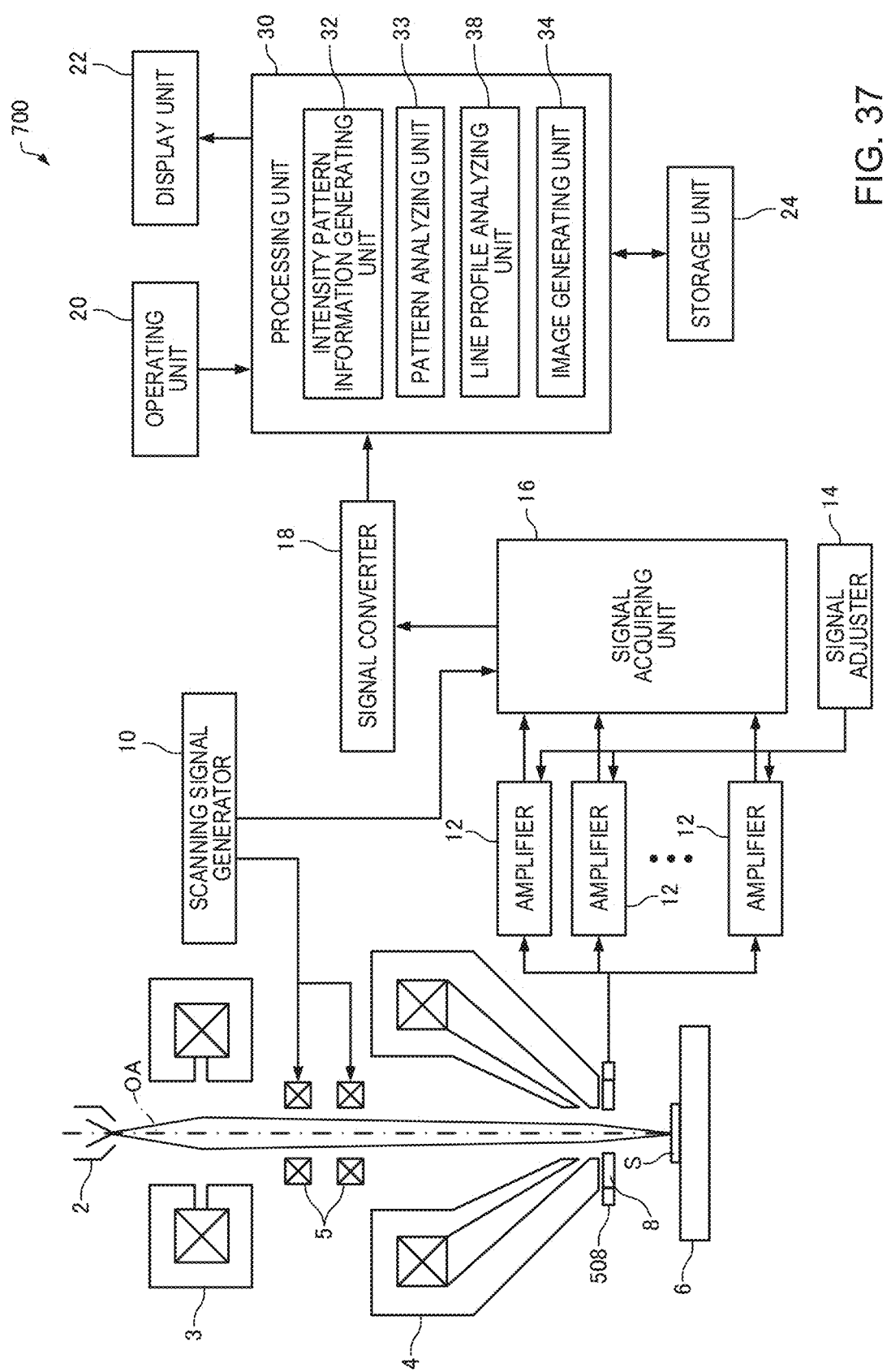
FIG. 37 is a diagram illustrating a configuration of an electron microscope according to a seventh embodiment.

Next, an electron microscope according to a seventh embodiment will be described with reference to the drawings. FIG. 37 is a diagram illustrating a configuration of an electron microscope 700 according to the seventh embodiment.

Hereinafter, in the electron microscope 700 according to the seventh embodiment, members having similar functions to the components of the electron microscope 100 according to the first embodiment and the electron microscope 500 according to the fifth embodiment will be denoted by same reference characters and a detailed description thereof will be omitted.

As illustrated in FIG. 37, the electron microscope 700 includes both the electron detector 8 and the electron detector 508.

Figure 38:
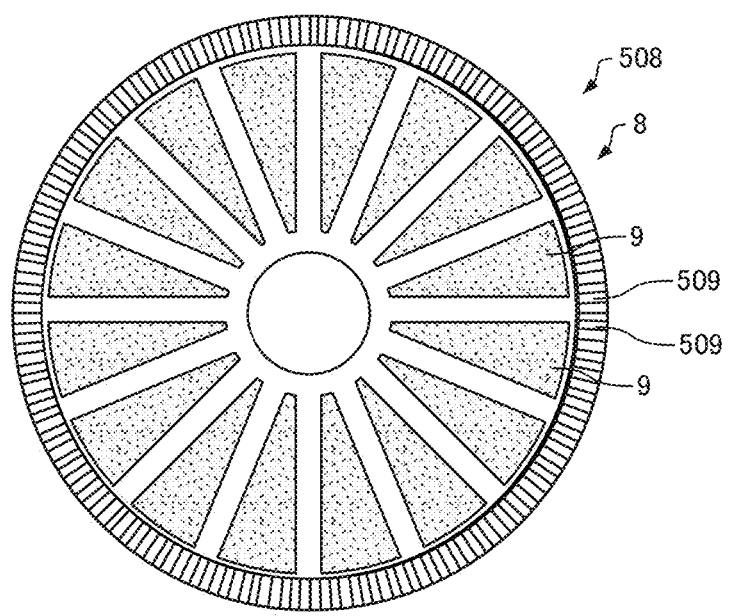
FIG. 38 is a plan view schematically illustrating two electron detectors.

FIG. 38 is a plan view schematically illustrating the electron detector 8 and the electron detector 508 mounted to the electron microscope 700.

As illustrated in FIG. 38, n'-number of detection regions 509 are arranged so as to enclose n-number of detection regions 9 formed by segmenting an annular detector plane in a circumferential direction. The electron detector 8 and the electron detector 508 are integrally configured and are simultaneously operable.

Alternatively, the electron detector 8 and the electron detector 508 may be separately configured. In addition, although not illustrated, the electron microscope 700 may be configured so as to include a moving mechanism for moving the electron detector 8 and a moving mechanism for moving the electron detector 508. In this case, when using the electron detector 8, the electron detector 8 is moved onto the optical axis OA and, at the same time, the electron detector 508 is retracted from the optical axis OA, and when using the electron detector 508, the electron detector 508 is moved onto the optical axis OA and, at the same time, the electron detector 8 is retracted from the optical axis OA.

7.2. Processes

With the electron detector 508, since an area of one detection region 509 is small, a signal amount that can be acquired per unit time is small. Therefore, in the electron detector 508, a period of time during which an analysis point is irradiated by an electron beam must be extended as compared to the electron detector 8.

However, extending the period of time during which the electron beam is irradiated gives rise to problems such as contamination of the specimen, deformation of the specimen due to heat, and charging of the specimen. Therefore, in the electron microscope 700, including both the electron detector 8 and the electron detector 508 enables acquisition of an image (for example, a pattern analysis image, a crystal grain boundary image, or the like) which enables a shape of a crystalline particle to be confirmed using the electron detector 8 by increasing a scan speed of the electron beam and enables acquisition of a crystal grain boundary image using the electron detector 508 by analyzing a crystal orientation while using at least one point in the crystalline particle as an analysis point. A specific description of this process will be given below.

As described in the first embodiment above, a crystal grain boundary image which enables a shape of a crystalline particle to be confirmed can be acquired using the electron detector 8.

Figure 39:
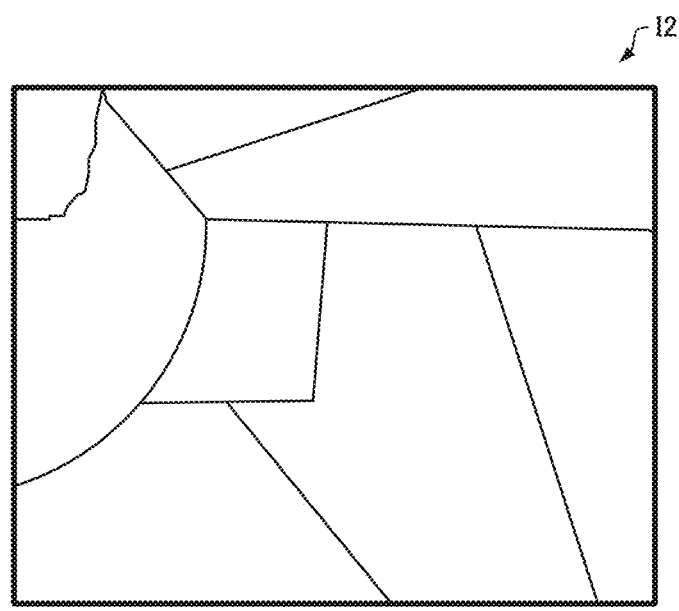
FIG. 39 is a diagram schematically illustrating a crystal grain boundary image.
Figure 40:
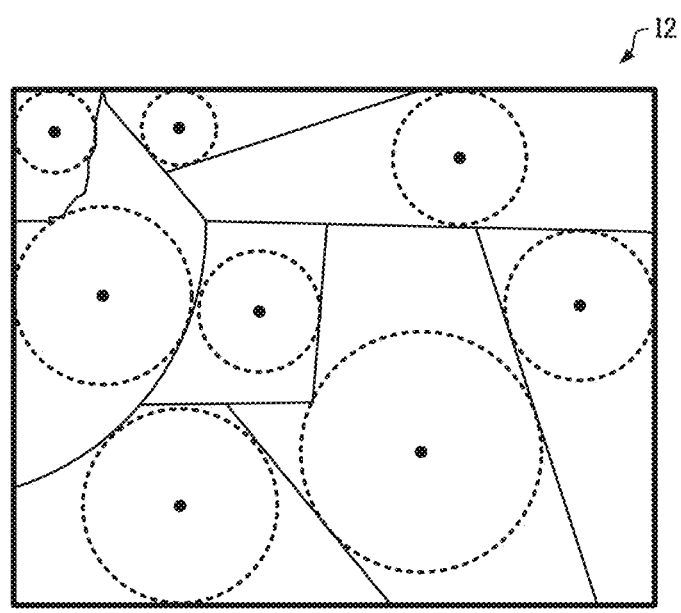
FIG. 40 is a diagram schematically illustrating a state where inscribed circles are drawn in a crystal grain boundary image.

FIG. 39 is a diagram schematically illustrating a crystal grain boundary image 12. FIG. 40 is a diagram schematically illustrating a state where inscribed circles are drawn in the crystal grain boundary image 12.

In the crystal grain boundary image 12, an analysis point is set for each crystalline particle. For example, as illustrated in FIG. 40, an inscribed circle is drawn in a crystalline particle in the crystal grain boundary image, a center of the inscribed circle is obtained, and the center is adopted as an analysis point. This process is performed with respect to all crystalline particles in the crystal grain boundary image. Accordingly, one analysis point can be set with respect to one crystalline particle.

With respect to the analysis point set for each crystalline particle in this manner, a crystal orientation is specified by the process described in the fifth embodiment above. As a result, crystal orientations can be specified with respect to the crystalline particles in the crystal grain boundary image 12 and a crystal orientation image can be generated.

7.3. Flow of Processes

Figure 41:
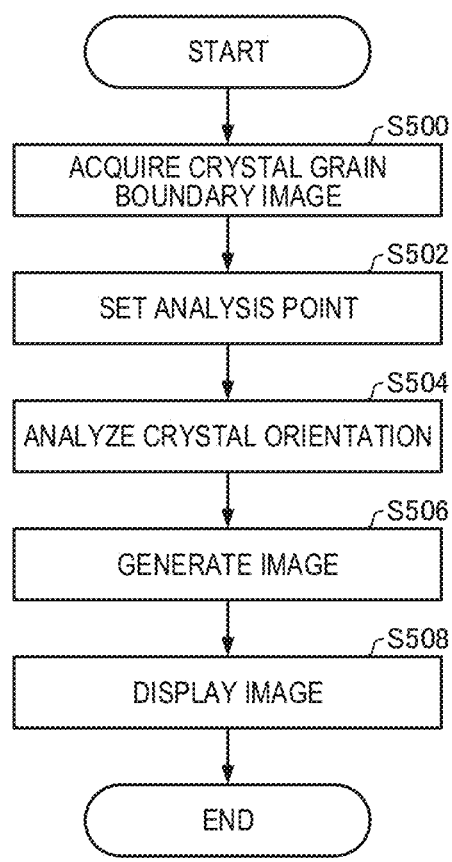
FIG. 41 is a flowchart illustrating an example of a flow of processes by a processing unit of the electron microscope according to the seventh embodiment.

Next, a flow of processes performed by the processing unit 30 of the electron microscope 700 according to the seventh embodiment will be described. FIG. 41 is a flowchart illustrating an example of the flow of processes by the processing unit 30 of the electron microscope 700 according to the seventh embodiment.

First, the intensity pattern information generating unit 32, the pattern analyzing unit 33, and the image generating unit 34 performs the process of generating an intensity pattern (S100), the process of generating pattern analysis information (S102), and the process of generating an image (S104) as illustrated in FIG. 16 and acquire a crystal grain boundary image (S500).

Next, the intensity pattern information generating unit 32 sets an analysis point for each crystalline particle in the crystal grain boundary image (S502). The intensity pattern information generating unit 32 performs, with respect to all crystalline particles in the crystal grain boundary image, a process involving drawing an inscribed circle in a crystalline particle in the crystal grain boundary image, obtaining a center of the inscribed circle, and adopting the center as an analysis point.

Next, the intensity pattern information generating unit 32 and the line profile analyzing unit 38 perform the process of generating reference line profiles (S400), the process of acquiring an intensity line profile (S402), and the process of analyzing a crystal orientation (S404) as illustrated in FIG. 32 with respect to all of the set analysis points (S504). Accordingly, crystal orientations of all crystalline particles in the crystal grain boundary image can be specified.

The image generating unit 34 generates an image based on the crystal grain boundary image and a specification result (crystal orientation information) of the crystal orientations of the crystalline particles (S506). Based on the obtained crystal orientation information, the image generating unit 34 sets each crystalline particle to a color and a brightness corresponding to the crystal orientation and generates a crystal orientation image.

Next, the image generating unit 34 performs control for causing the generated crystal orientation image to be displayed by the display unit 22 (S508). At this point, the image generating unit 34 may cause information on the specified crystal orientations to be displayed on the generated crystal orientation image.

7.4. Features

For example, the electron microscope 700 has the following features.

The electron microscope 700 includes both the electron detector 8 and the electron detector 508. Therefore, a crystal orientation image can be readily acquired.

It should be noted that the process of calculating a diffraction pattern based on a result of an elemental analysis using the X-ray detector 602 in the electron microscope 600 according to the sixth embodiment described above is also applicable to the seventh embodiment.

7.5. Modification

A modification of the electron microscope 700 according to the seventh embodiment will be described.

In the seventh embodiment described above, an analysis of a crystal orientation is performed at one point in a crystalline particle. However, irradiating one point of a specimen for a long period of time by an electron beam causes localized specimen contamination at the one point. The specimen contamination can be verified by acquiring an SEM image at this location.

Therefore, in this modification, electrons emitted from a specimen S are detected by both the electron detector 8 and the electron detector 508 while scanning an electron beam. In addition, a crystal grain boundary image is generated from detection signals of the electron detector 8 and crystalline particles are specified, and a detection signal of the electron detector 508 acquired in one crystalline particle is integrated to generate one intensity line profile. Accordingly, an intensity line profile can be acquire without having to irradiate one point of a specimen for a long period of time by an electron beam.

Furthermore, the seventh embodiment above describes a case where an analysis of crystal orientations is performed on the assumption that crystal orientations are the same in one crystalline particle. However, crystal orientations may sometimes differ even in a crystalline particle. Even in such cases, since a crystal orientation image and a crystal grain boundary image reveal a change in crystal orientations in a crystalline particle, an analysis of crystal orientations may be performed with respect to such crystalline particles by increasing analysis points.

8. Other

In the first to seventh embodiments described above, a clear diffraction pattern can be acquired by causing a low-energy electron beam to be incident to a specimen S in a state where a specimen surface thereof is horizontal or almost horizontal (for example, with a specimen tilt angle equal to or smaller than 10 degrees). A reason therefor will be described below.

When an electron beam is incident to a specimen, the electron beam is scattered inside the specimen and electrons with various energy levels are emitted from a specimen surface. A diffraction pattern used in an analysis of a crystal orientation by the EBSD method is attributable to electrons with less energy loss relative to incidence energy among the electrons emitted from the specimen surface.

Figure 42:
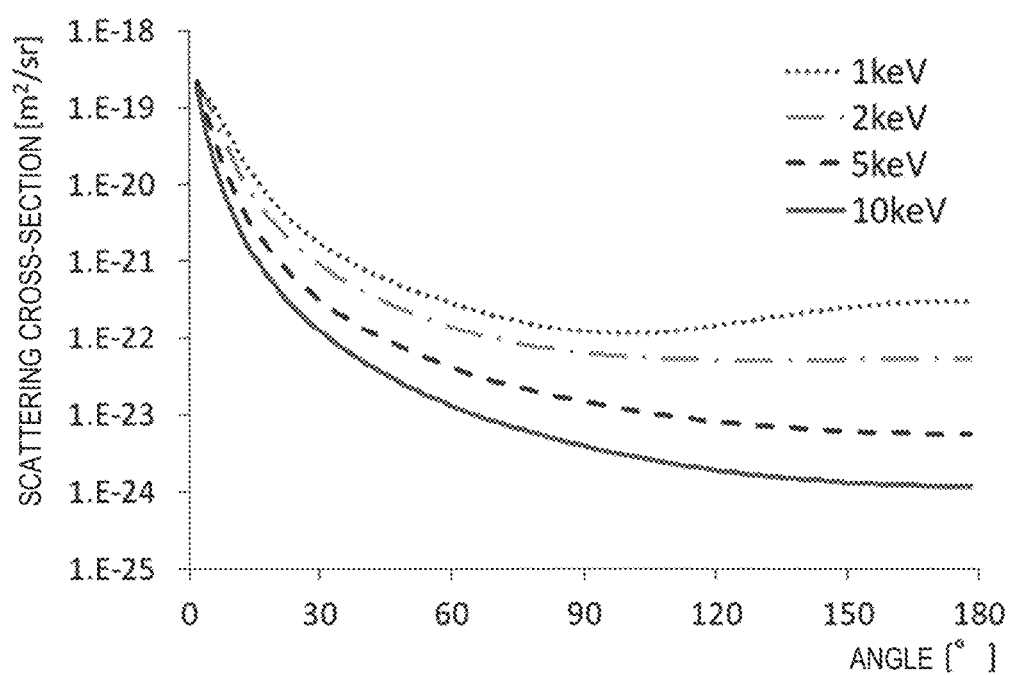
FIG. 42 is a graph illustrating elastic scattering cross-sections of electrons with respect to an iron atom.

FIG. 42 is a graph illustrating elastic scattering cross-sections of electrons with respect to an iron atom. The graph illustrated in FIG. 42 indicates an amount of angular change and a probability thereof when rectilinearly moving electrons approach an atom and scattering of the electrons occurs due to interaction between the electrons and the atom.

First, a case where an energy level of the electrons incident to a specimen is high will be considered. As is apparent from the graph illustrated in FIG. 42, high-energy electrons exhibit a small amount of angular change even when scattered inside the specimen. In addition, while electrons incident to the specimen are scattered after penetrating to a depth of a mean free path instead of being scattered on an outermost surface of the specimen, the higher the energy level of the electrons, the longer the mean free path. Therefore, when a specimen is arranged horizontally and a high-energy electron beam is incident to the specimen or, in other words, when a high-energy electron beam is vertically incident to the specimen surface, scattering of the electrons occurs at a relatively deep region from the specimen surface and a large portion of the electrons scatters in a depth direction of the specimen. Furthermore, even in an extremely rare event that electrons reach the specimen surface to be emitted from the specimen, since such electrons have been repetitively scattered, energy loss by the electrons is large. Therefore, even when the specimen is arranged horizontally and a high-energy electron beam is incident to the specimen, only a very small amount of electrons which have less energy loss and which form a diffraction pattern is emitted from the specimen surface.

In consideration thereof, in the EBSD method, the specimen is greatly tilted and the electron beam is incident with respect to the specimen surface from an oblique direction. Accordingly, since a scattering region of the electrons in the specimen and the specimen surface approach each other, electrons which have scattered fewer times or, in other words, electrons with less energy loss may more readily reach the specimen surface. As a result, since a larger amount of electrons which have less energy loss and which form a diffraction pattern are emitted from the specimen surface, a diffraction pattern may be more readily obtained.

Next, a case where an energy level of the electrons incident to a specimen is low will be considered. As illustrated in FIG. 42, low-energy electrons have a higher probability of scattering in a 180-degree direction than high-energy electrons. Therefore, when a low-energy electron beam is incident to the specimen, a scattering amount in a direction opposite to the incidence direction of the electron beam increases. In addition, since low-energy electrons have a shorter mean free path in the specimen than high-energy electrons, scattering is more likely to occur near the specimen surface. Consequently, when a low-energy electron beam is incident to the specimen, a large amount of electrons with less energy loss is emitted even when the specimen surface is horizontal.

Therefore, a clear diffraction pattern can be acquired by causing a low-energy electron beam to be incident to a specimen S in a state where a specimen surface thereof is horizontal or almost horizontal (for example, with a specimen tilt angle equal to or smaller than 10 degrees). For example, accelerating voltage is set to 10 kV or lower and more favorably to 5 kV or lower. Accordingly, low-energy electrons can be caused to be incident to the specimen S and a clear diffraction pattern can be obtained even in a state where the specimen surface is horizontal or almost horizontal.

Figure 43:
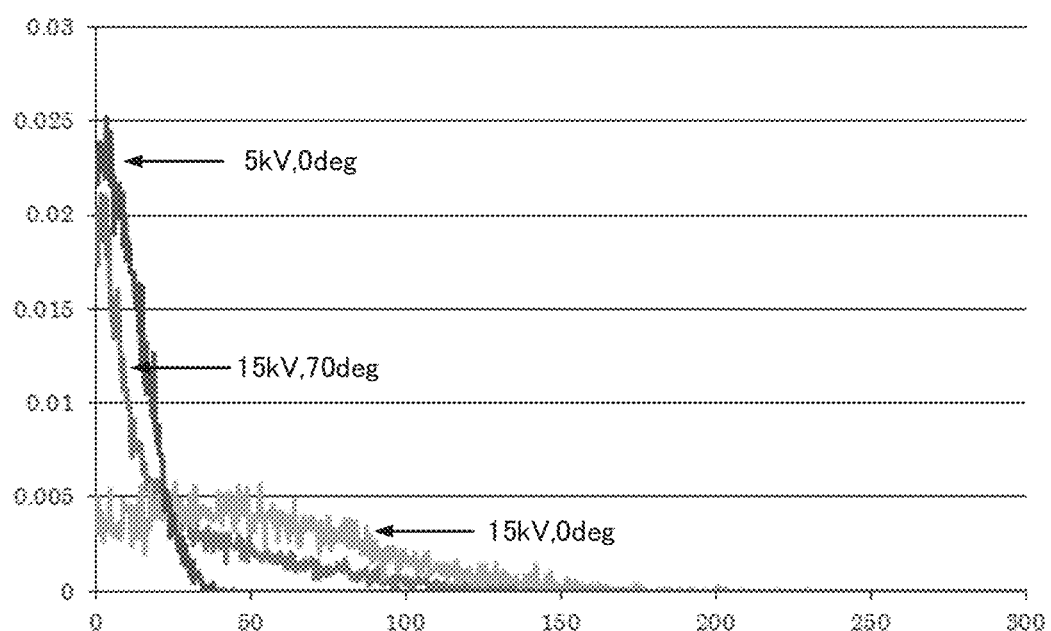
FIG. 43 is a graph illustrating depths where scattering of electrons emitted from a specimen had occurred.

FIG. 43 is a graph illustrating depths where scattering of electrons (backscattered electrons) emitted from a specimen had occurred. An abscissa represents a depth where scattering had occurred and an ordinate represents a ratio of electrons having caused the scattering at that depth. The specimen in FIG. 43 is gold.

Conditions including an accelerating voltage of 15 kV and a specimen tilt angle of 70 deg represent conditions generally used in the EBSD method in order to acquire a Kikuchi line. A specimen tilt angle refers to a tilt angle of the specimen surface relative to a horizontal direction. In other words, a specimen tilt angle represents a tilt of the specimen surface when a horizontal plane is used as a reference or, in other words, when a horizontal plane represents 0 degrees. It is assumed that an electron beam is to be incident to the specimen from a vertical direction relative to a horizontal plane.

When the accelerating voltage is 15 kV and the specimen tilt angle is 70 deg, a ratio of electrons having caused scattering at depths of 40 nm or less among the electrons emitted from the specimen is 80% or more. In this manner, by increasing the specimen tilt angle, depths at which scattering of electrons occur can be made shallower and a ratio of electrons with less energy loss among the electrons emitted from the specimen can be increased. Accordingly, a clear diffraction pattern can be obtained.

When the accelerating voltage is 15 kV and the specimen tilt angle is 0 deg (in other words, when the specimen surface is horizontal), scattering also occurs in regions deeper than 100 nm. As a result, under these conditions, contrasts of diffraction patterns are weak and a clear diffraction pattern cannot be obtained.

Conversely, when the accelerating voltage is 5 kV and the specimen tilt angle is 0 deg, scattering occurs in shallow locations in a concentrated manner. As illustrated in FIG. 43, when the accelerating voltage is 5 kV and the specimen tilt angle is 0 deg, depths at which electrons caused scattering are concentrated at or under 40 nm. Specifically, when the accelerating voltage is 5 kV and the specimen tilt angle is 0 deg, a ratio of electrons having caused scattering at depths of 40 nm or less among the electrons emitted from the specimen is 90% or more. In this manner, by reducing the accelerating voltage, even in a state where the specimen surface is horizontal or almost horizontal, depths at which electrons cause scattering can be made shallower and a ratio of electrons with less energy loss among the electrons emitted from the specimen can be increased.

As described above, by causing a low-energy electron beam to be incident to a specimen in a state where the specimen is held so that a specimen surface thereof is horizontal or almost horizontal (for example, with a specimen tilt angle equal to or smaller than 10 degrees), electrons cause scattering in shallow regions of the specimen and electrons with less energy loss are emitted from the specimen. As a result, a clear diffraction pattern is projected on a plane on which the electron detector 8 and the electron detector 508 are arranged.

It should be noted that, by causing a low-energy electron beam to be incident to a specimen, a scattering region of electrons becomes smaller than when causing a high-energy electron beam to be incident to the specimen. Accordingly, since an occurrence region of backscattered electrons also becomes smaller, orientation analysis at a high spatial resolution can be performed.

It should be noted that the embodiments and the modifications described above are merely examples and the invention is not limited thereto. For example, the respective embodiments and the respective modifications may be combined as deemed appropriate.

The invention includes configurations that are substantially the same (for example, in function, method, and results, or in objective and effects) as the configurations described in the embodiments. The invention also includes configurations in which non-essential elements described in the embodiments are replaced by other elements. The invention also includes configurations having the same effects as those of the configurations described in the embodiments, or configurations capable of achieving the same objectives as those of the configurations described in the embodiments. The invention further includes configurations obtained by adding known art to the configurations described in the embodiments.

Some embodiments of the invention have been described in detail above, but a person skilled in the art will readily appreciate that various modifications can be made from the embodiments without materially departing from the novel teachings and effects of the invention. Accordingly, all such modifications are assumed to be included in the scope of the invention.

The invention claimed is:

1. A scanning electron microscope (SEM) comprising:
a plurality of detecting units which detect backscattered electrons scattered by a specimen;
an intensity pattern information generating unit which generates, based on intensities of a plurality of detection signals output from the plurality of detecting units, intensity pattern information that represents the intensities of the plurality of detection signals as a pattern;
a scanning deflector for scanning the specimen with an electron beam;
a pattern analyzing unit which analyzes the intensity pattern information associated with an incidence position of the electron beam with respect to the specimen; and
an image generating unit which generates a pattern analysis image which indicates a distribution of crystal orientations of the specimen based on an analysis result by the pattern analyzing unit,
wherein the plurality of detecting units are constituted by a segmented detector having a plurality of first to n-th detection regions which are arranged to be rotationally symmetric around an optical axis,
the segmented detector has a through-hole for allowing the electron beam to pass and travel along the optical axis,
first to n-th detection signals are output from the first to n-th detection regions, respectively, and
the pattern of the intensity pattern information is formed by plotting intensities of the first to n-th detection signals on intensity axes of the first to n-th detection signals, respectively.

2. The SEM according to claim 1, wherein
the pattern analyzing unit compares reference intensity pattern information to be used as a reference and the intensity pattern information with each other, and to analyze the intensity pattern information.

3. The SEM according to claim 2, further comprising:
an Electron Back Scatter Diffraction Patterns (EBSD) detector which acquires an EBSD pattern obtained by irradiating the specimen with the electron beam, wherein
the image generating unit specifies a crystal orientation from the EBSD pattern and a crystal orientation at each of a plurality of pixels forming the pattern analysis image.

4. The SEM according to claim 3, wherein
the pattern analyzing unit compares the intensity pattern information at each of a plurality of pixels forming the pattern analysis image, with the reference intensity pattern information, and classifies the pixels into groups; and
the pattern analyzing unit acquires the EBSD pattern for each of the groups and specifies a crystal orientation in each of the groups.

5. The SEM according to claim 3, wherein
the pattern analyzing unit specifies crystal orientations of crystalline particles in the pattern analysis image based on the EBSD pattern; and
the pattern analyzing unit specifies a crystal orientation of a crystalline particle having a crystal orientation which cannot be specified based on the EBSD pattern among the crystalline particles included in the pattern analysis image, based on the intensity pattern information of crystalline particles having crystal orientations which have been specified based on the EBSD pattern.

6. The SEM according to claim 2, wherein
the pattern analyzing unit acquires the reference intensity pattern information from a database in which the reference intensity pattern information is registered for each crystal orientation; and
the pattern analyzing unit specifies a crystal orientation by comparing the reference intensity pattern information registered in the database with the intensity pattern information.

7. The SEM according to claim 1, wherein
the pattern analyzing unit specifies a crystal orientation based on symmetry of the pattern based on the intensity pattern information.

8. The SEM according to claim 1, wherein
the pattern analyzing unit compares reference intensity pattern information to be used as a reference with the intensity pattern information, and
the image generating unit generates a crystal grain boundary image in which crystal grain boundaries of the specimen are extracted.

9. The SEM according to claim 1, wherein
the intensity pattern information generating unit generates the intensity pattern information by normalizing intensities of a plurality of detection signals output from the plurality of detecting units.

10. A scanning electron microscope (SEM) comprising:
a plurality of detecting units which detect backscattered electrons scattered by a specimen;
a scanning deflector for scanning the specimen with an electron beam;
an intensity pattern information generating unit which generates a line profile based on intensities of a plurality of detection signals output from the plurality of detecting units; and
a line profile analyzing unit which specifies a crystal orientation based on the line profile,
wherein the plurality of detecting units are constituted by a segmented detector having a plurality of first to n-th detection regions which are arranged to be rotationally symmetric around an optical axis,
the segmented detector has a through-hole for allowing the electron beam to pass and travel along the optical axis.

11. The SEM according to claim 10, further comprising
an X-ray detector which detects X-rays generated by irradiating the specimen with the electron beam, wherein
the line profile analyzing unit:
obtains a diffraction pattern by a calculation based on a result of an elemental analysis using the X-ray detector;
generates a reference line profiles to be used as a reference from the obtained diffraction pattern; and
specifies a crystal orientation by comparing a line profile as the intensity pattern information with the reference line profile.

12. An analysis method comprising:
using a scanning electron microscope (SEM) to detect backscattered electrons scattered by a specimen with a plurality of detecting units;
generating, based on intensities of a plurality of detection signals output from the plurality of detecting units, intensity pattern information that represents the intensities of the plurality of detection signals as a pattern;
analyzing the intensity pattern information associated with an incidence position of the electron beam with respect to the specimen; and
generating a pattern analysis image which indicates a distribution of crystal orientations of the specimen based on an analysis result by a pattern analyzing unit,
wherein the plurality of detecting units are constituted by a segmented detector having a plurality of first to n-th detection regions which are arranged to be rotationally symmetric around an optical axis,
the segmented detector has a through-hole for allowing the electron beam to pass and travel along the optical axis,
first to n-th detection signals are output from the first to n-th detection regions, respectively, and
the pattern of the intensity pattern information is formed by plotting intensities of the first to n-th detection signals on intensity axes of the first to n-th detection signals, respectively.

13. An analysis method, comprising:
using a scanning electron microscope (SEM) to detect backscattered electrons scattered by a specimen with a plurality of detecting units;
generating a line profile based on intensities of detection signals output from the plurality of detecting units; and
specifying a crystal orientation based on the line profile,
wherein the plurality of detecting units are constituted by a segmented detector having a plurality of first to n-th detection regions which are arranged to be rotationally symmetric around an optical axis,
the segmented detector has a through-hole for allowing the electron beam to pass and travel along the optical axis.

* * * * *

UNITED STATES PATENT AND TRADEMARK OFFICE
CERTIFICATE OF CORRECTION

PATENT NO. : 10,935,505 B2  
APPLICATION NO. : 16/234868  
DATED : March 2, 2021  
INVENTOR(S) : Takeshi Otsuka et al.

Page 1 of 1

It is certified that error appears in the above-identified patent and that said Letters Patent is hereby corrected as shown below:

On the Title Page

Item (54) and in the Specification, Column 1, Line 3, Title, delete "ORIENTATIONS" and insert -- ORIENTATION --

Signed and Sealed this  
Tenth Day of August, 2021

Drew Hirshfeld  
*Performing the Functions and Duties of the*  
*Under Secretary of Commerce for Intellectual Property and*  
*Director of the United States Patent and Trademark Office*